(12) United States Patent
Li et al.

(10) Patent No.: US 9,142,762 B1
(45) Date of Patent: Sep. 22, 2015

(54) MAGNETIC TUNNEL JUNCTION AND METHOD FOR FABRICATING A MAGNETIC TUNNEL JUNCTION

(71) Applicant: QUALCOMM Incorporated

(72) Inventors: Xia Li, San Diego, CA (US); Kangho Lee, San Diego, CA (US); Wei-Chuan Chen, Taipei (TW); Yu Lu, San Diego, CA (US); Chando Park, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/229,427

(22) Filed: Mar. 28, 2014

(51) Int. Cl.
  *H01L 21/00* (2006.01)
  *H01L 43/12* (2006.01)
  *H01L 43/08* (2006.01)
  *H01L 27/22* (2006.01)

(52) U.S. Cl.
  CPC .............. *H01L 43/12* (2013.01); *H01L 27/224* (2013.01); *H01L 43/08* (2013.01)

(58) Field of Classification Search
  CPC ..... H01L 27/22; H01L 27/222; H01L 27/224; H01L 43/08; H01L 43/12
  USPC ............... 438/3, 795, 796; 257/295, 421, 427
  See application file for complete search history.

(56) References Cited

U.S. PATENT DOCUMENTS

| | | | |
|---|---|---|---|
| 6,897,532 B1 * | 5/2005 | Schwarz et al. | 257/367 |
| 7,320,942 B2 * | 1/2008 | Chen et al. | 438/754 |
| 8,119,425 B2 * | 2/2012 | Cho et al. | 438/3 |
| 8,491,799 B2 | 7/2013 | Jung | |
| 8,866,242 B2 * | 10/2014 | Li et al. | 257/421 |
| 2004/0127054 A1 | 7/2004 | Lee et al. | |
| 2004/0129361 A1 * | 7/2004 | Chen et al. | 156/58 |
| 2011/0121417 A1 | 5/2011 | Li et al. | |
| 2012/0135543 A1 | 5/2012 | Shin et al. | |
| 2012/0205764 A1 | 8/2012 | Chen et al. | |
| 2013/0082339 A1 | 4/2013 | Aggarwal et al. | |
| 2013/0146997 A1 | 6/2013 | Lee et al. | |
| 2013/0244342 A1 | 9/2013 | Wang et al. | |

OTHER PUBLICATIONS

International Search Report and Written Opinion—PCT/US2015/018274—ISA/EPO—Jun. 2, 2015.

* cited by examiner

*Primary Examiner* — Kevin M Picardat
(74) *Attorney, Agent, or Firm* — Muncy, Geissler, Olds & Lowe, P.C.

(57) ABSTRACT

An improved magnetic tunnel junction device and methods for fabricating the improved magnetic tunnel junction device are provided. The provided two-etch process reduces etching damage and ablated material redeposition. In an example, provided is a method for fabricating a magnetic tunnel junction (MTJ). The method includes forming a buffer layer on a substrate, forming a bottom electrode on the substrate, forming a pin layer on the bottom electrode, forming a barrier layer on the pin layer, and forming a free layer on the barrier layer. A first etching includes etching the free layer, without etching the barrier layer, the pin layer, and the bottom electrode. The method also includes forming a top electrode on the free layer, as well as forming a hardmask layer on the top electrode. A second etching includes etching the hardmask layer; the top electrode layer, the barrier layer, the pin layer, and the bottom electrode.

10 Claims, 31 Drawing Sheets

PARALLEL MAGNETIZATION
LOW RESISTANCE
STATE "0"

ANTIPARALLEL MAGNETIZATION
HIGH RESISTANCE
STATE "1"

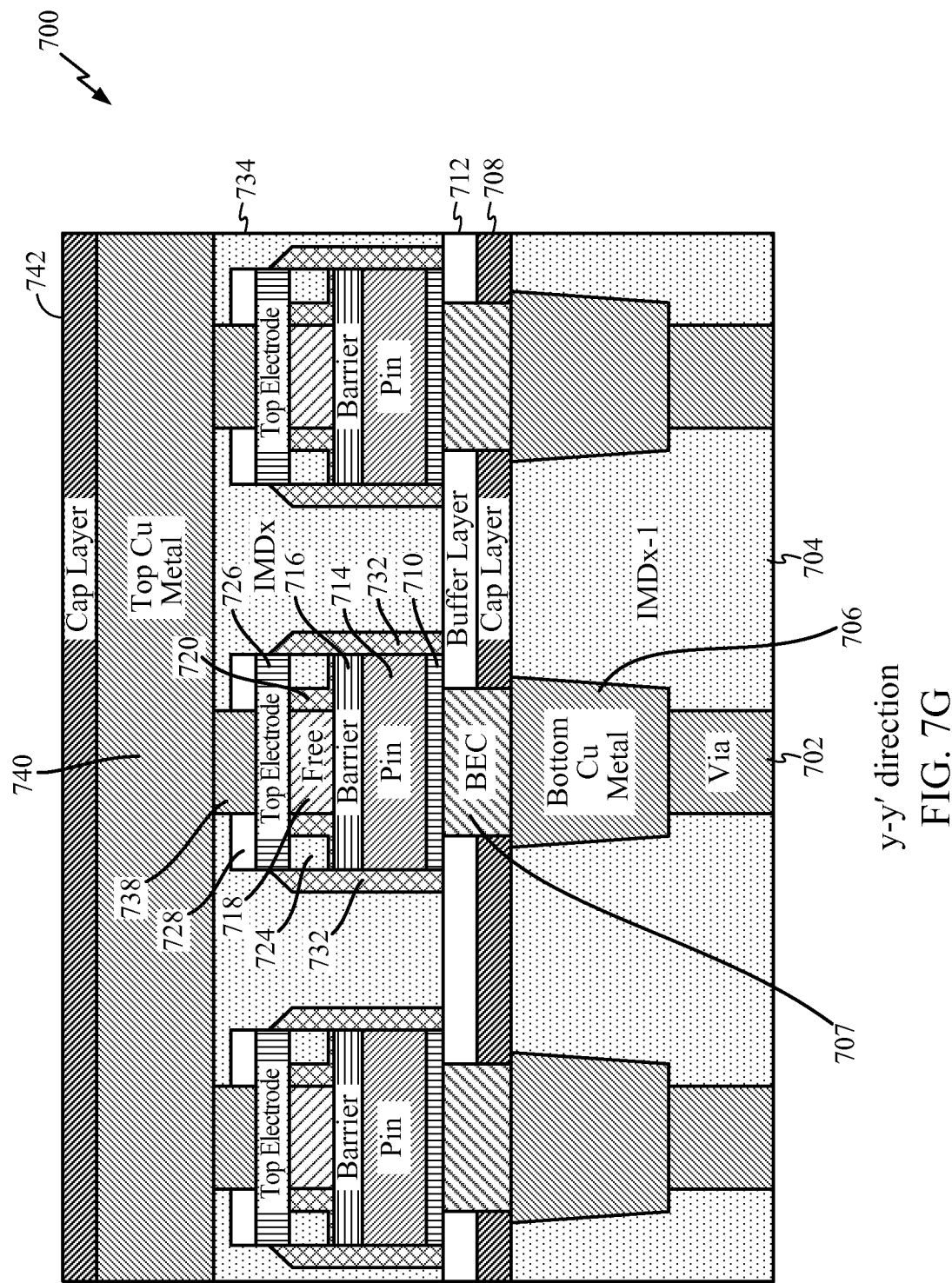
FIG. 7G  y-y' direction

MAGNETIC TUNNEL JUNCTION AND METHOD FOR FABRICATING A MAGNETIC TUNNEL JUNCTION

FIELD OF DISCLOSURE

This disclosure relates generally to electronics, and more specifically, but not exclusively, to an improved magnetic tunnel junction device and methods for fabricating the improved magnetic tunnel junction device.

BACKGROUND

Random access memory (RAM) is a ubiquitous component of modern digital architectures. RAM can be a standalone device, or can be integrated in a device that uses the RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain its contents without applied power, conventional non-volatile RAM has slower read/write times than volatile RAM.

Magnetoresistive Random Access Memory (MRAM) is a non-volatile memory technology having response (read/write) times comparable to volatile memory. In contrast to conventional RAM technologies, which store data as electric charges or current flows, MRAM uses magnetic elements. As illustrated in FIGS. 1A and 1B, an in-plane magnetic tunnel junction (iMTJ) storage element 100 (also known as an "iMTJ stack") can be formed from two magnetic layers, a pin layer 110 (also known as a "fixed layer"), and a free layer 130, each of which can retain a magnetic moment or polarization, separated by an insulating layer 120 (also known as a "tunnel barrier layer"). One of the two magnetic layers (e.g., fix or pin layer 110), is fixed or pinned to a particular polarity. The other magnetic layer's (e.g., free layer 130) polarity 132 is free to change to switch magnetic moment polarity orientation. The free layer 130 can be switched by a field or a current by spin torque. A change in the polarity 132 of the free layer 130 changes the resistance of the MTJ storage element 100. For example, when the polarities are aligned, as depicted in FIG. 1A, a low resistance state exists. When the polarities are reverse-aligned, as depicted in FIG. 1B, then a high resistance state exists. The polarization of the free layer 130 can be reversed by applying current in a specific direction such that the polarity of the pin layer 110 and the free layer 130 are either substantially aligned or opposite. The resistance of the electrical path through the MTJ changes depending on the alignment of the polarizations of the pin layer 110 and the free layer 130. The illustration of MTJ 100 is simplified, and each layer illustrated can comprise one or more layers of materials. There is also a perpendicular MTJ (pMTJ), in which magnetic moment polarity is vertically aligned or reverse aligned to fix a layer moment. The pMTJ also can be switched by a field or a current to provide a high resistance state (reverse aligned) and a low resistance state (aligned).

Referring to FIG. 2A, a memory cell 200 of a conventional field switching MRAM is depicted during a read operation. The cell 200 includes a transistor 210, a bit line 220, a digit line 230 and a word line 240. The cell 200 is read by measuring the electrical resistance of the MTJ 100. For example, a particular MTJ 100 can be selected by activating an associated transistor 210, which can switch current from a bit line 220 through the MTJ 100. Due to a tunnel magnetoresistive effect, the electrical resistance of the MTJ 100 changes based on the magnetic moment orientation of the polarities in the two magnetic layers (e.g., 110, 130), as discussed above. A resistance inside any particular MTJ 100 can be determined from a current intensity determined by the polarity of the free layer. If the fix or pin layer 110 and free layer 130 have the same polarity, the resistance is low and a logic "0" is read. If the fix or pin layer 110 and free layer 130 have an opposing polarity, the resistance is higher and a logic "1" is read.

Referring to FIG. 2B, the memory cell 200 of a conventional field switching MRAM is depicted during a write operation, which is a magnetic operation. Transistor 210 is off during the write operation. Current propagates through the bit line 220 and the digit line 230 to establish magnetic fields 250 and 260, which affect the polarity of the free layer of the MTJ 100, and consequently the logic state of the cell 200. Accordingly, data can be written to, and stored in, the MTJ 100.

MRAM has several desirable characteristics that make it a candidate for a universal memory, such as high speed, high density (i.e., small bitcell size), low power consumption, and no degradation over time.

A variation of MRAM is Spin Transfer Torque Magnetoresistive Random Access Memory (STT-MRAM). STT-MRAM uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During a write operation, the spin-polarized electrons exert torque on a free layer, which switches a polarity of the free layer. During a read operation, a current detects the resistance/logic state of the MTJ storage element, as discussed in the foregoing description. As illustrated in FIG. 3A, a STT-MRAM bit cell 300 includes a MTJ 305, a transistor 310, a bit line 320, and a word line 330. The transistor 310 is switched on for both read and write operations to allow current to flow through the MTJ 305, so the logic state can be read or written. There is also a perpendicular MTJ (pMTJ) (not shown), in which magnetic moment polarity is vertically aligned and/or reverse aligned to fix a layer moment. The pMTJ also can be switched by a field and/or a current to provide a high resistance state (reverse aligned) and a low resistance state (aligned).

Referring to FIG. 3B, a more detailed diagram of a STT-MRAM cell 301 is illustrated, for further discussion of the read/write operations. In addition to the previously discussed elements such as the MTJ 305, the transistor 310, the bit line 320 and the word line 330, a source line 340, a sense amplifier 350, read/write circuitry 360, and a bit line reference 370 are illustrated. As discussed above, the write operation in an STT-MRAM is electrical. The read/write circuitry 360 generates a write voltage between the bit line 320 and the source line 340. Depending on the polarity of the voltage between the bit line 320 and the source line 340, the polarity of the free layer of the MTJ 305 can be changed, and correspondingly, the logic state can be written to the cell 301. Likewise, during a read operation, a read current is generated, which flows between the bit line 320 and the source line 340 through the MTJ 305. When the current is permitted to flow via the transistor 310, the resistance (logic state) of the MTJ 305 is determined, based on the voltage differential between the bit line 320 and the source line 340, which is compared to a reference 370, and then amplified by the sense amplifier 350. Additional details are provided, for example, in U.S. Pat. No. 7,764,537, which is incorporated herein by reference in its entirety.

Accordingly, a non-volatile MRAM memory can be fabricated as an array of the memory cells 301. A gate of the transistor 310 is coupled to a word line (WL). During write operations, a supply voltage is applied to the bit line 320 or the source line 340. During read operations, a read voltage is applied to the bit line 320, and the source line 340 is set to ground. The WL is coupled to a supply voltage during both read and write operations.

Despite the characteristics described above, the memory cell 301 is not a perfect device. Etching an MTJ is a challenging part of the MTJ fabrication process. The conventional MTJ fabrication process includes a single-step etch that can damage an MTJ sidewall by etching the MTJ sidewall and redepositing ablated material on the MTJ sidewall, which degrades the MTJ's tunnel magnetoresistance (TMR), coersivity (Hc), and increases switching current when operating the MTJ.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for fabricating a device are provided. In an example, provided is a method for fabricating a magnetic tunnel junction (MTJ). The method includes forming a buffer layer on a substrate, forming a bottom electrode on the substrate, forming a pin layer on the bottom electrode, forming a barrier layer on the pin layer, and forming a metal cap/free layer on the barrier layer. A first etching includes etching the free layer, without etching the barrier layer, the pin layer, and the bottom electrode. The method also includes forming a top electrode on the free layer, as well as forming a hardmask layer on the top electrode. A second etching includes etching the hardmask layer; the top electrode layer, the barrier layer, the pin layer, and the bottom electrode. A metal line can be formed on, and coupled to, the top electrode. A via can be formed on, and coupled to, the top electrode to couple a metal line to the top electrode. Further, the magnetic tunnel junction can be integrated into at least one of an electronic device having a memory and an electronic device requiring a memory.

The magnetic tunnel junction can be integrated on a semiconductor die. Further, the magnetic tunnel junction can be a part of a device, such as a mobile device, a set top box, a music player, a video player, an entertainment unit, a navigation device, a communications device, a personal digital assistant (PDA), a fixed location data unit, and/or a computer.

In a further example, provided is a non-transitory computer-readable medium, comprising instructions stored thereon that, if executed by a processor, such as a special-purpose processor, cause the processor to execute at least a part of the aforementioned method.

In another example, provided is a method for fabricating a magnetic tunnel junction. The method includes a step for forming a buffer layer on a substrate, a step for forming a bottom electrode on the substrate, a step for forming a pin layer on the bottom electrode, a step for forming a barrier layer on the pin layer, and a step for forming a metal cap/free layer on the barrier layer. A step for first etching includes etching the free layer, without etching the barrier layer, the pin layer, and the bottom electrode. The method also includes a step for forming a top electrode on the free layer, as well as a step for forming a hardmask layer on the top electrode. A second etching includes a step for etching the hardmask layer; the top electrode layer, the barrier layer, the pin layer, and the bottom electrode. The method can also include a step for forming a metal line on, and coupled to, the top electrode. The method can also include a step for forming a via on, and coupled to, the top electrode to couple a metal line to the top electrode. Further, the method can also include a step for integrating the magnetic tunnel junction into at least one of an electronic device having a memory and an electronic device requiring a memory.

In a further example, provided is a non-transitory computer-readable medium, comprising instructions stored thereon that, if executed by a processor, such as a special-purpose processor, cause the processor to execute at least a part of the steps of the aforementioned method.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

FIGS. 6A-6D and 7A-7I depict an exemplary method for fabricating a first exemplary MTJ structure.

Figure 1A:
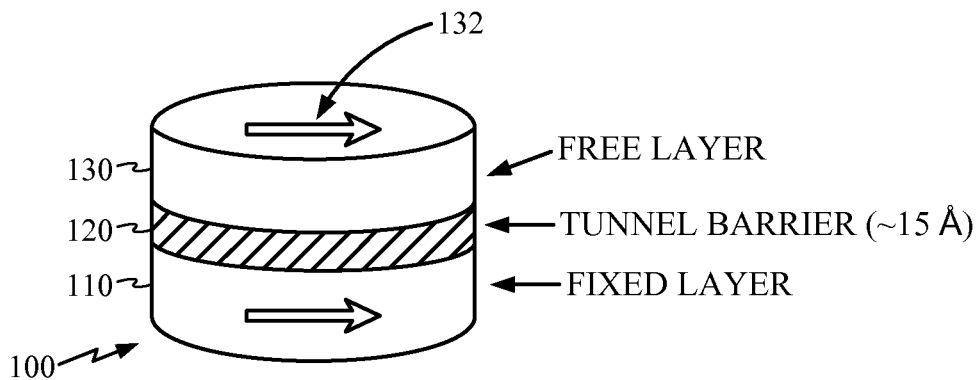
FIGS. 1A and 1B depict a magnetic tunnel junction (MTJ) storage element.
Figure 1B:
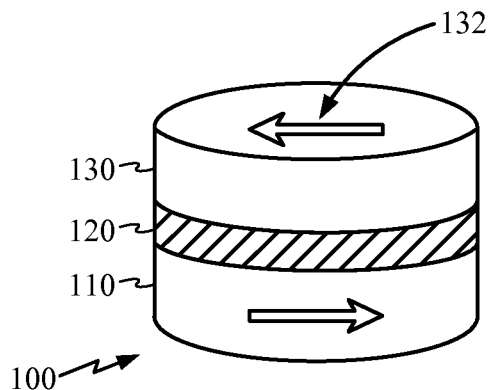
Figure 2A:
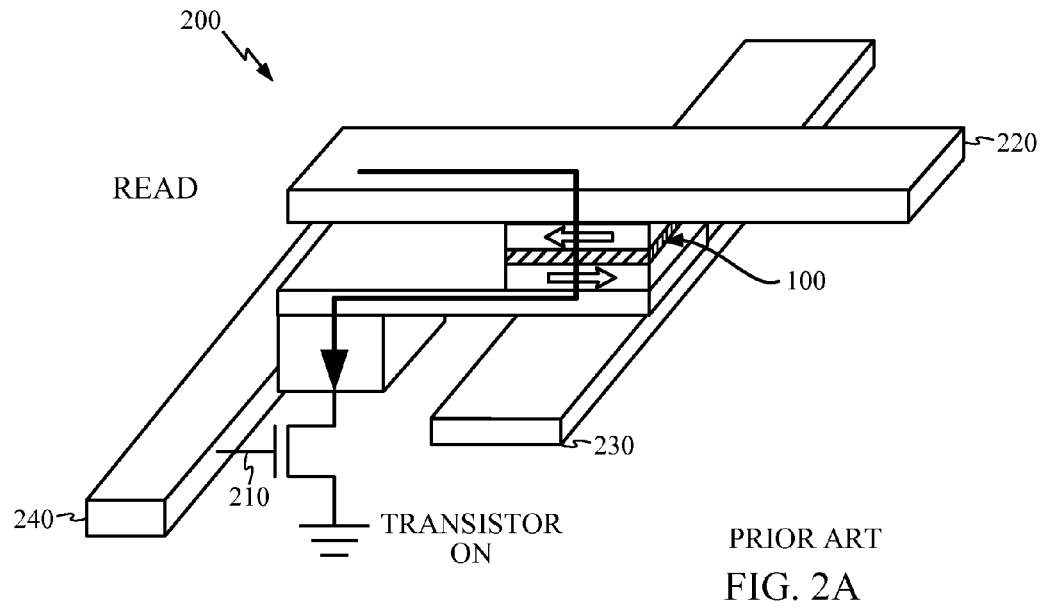
FIGS. 2A and 2B depict a field switching Magnetoresistive Random Access Memory (MRAM) cell during read and write operations, respectively.
Figure 2B:
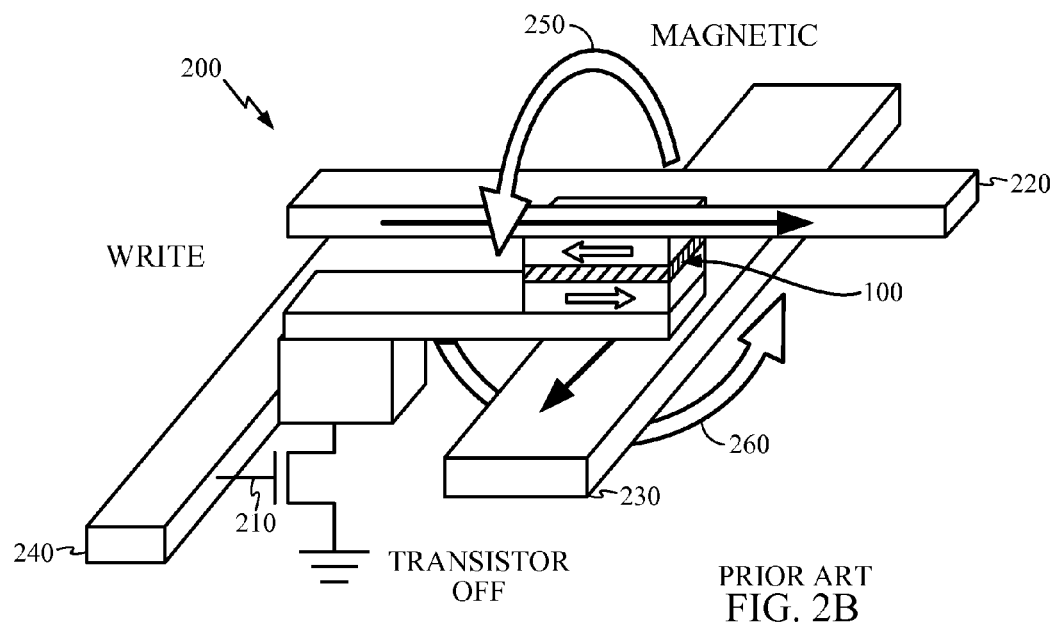
Figure 3A:
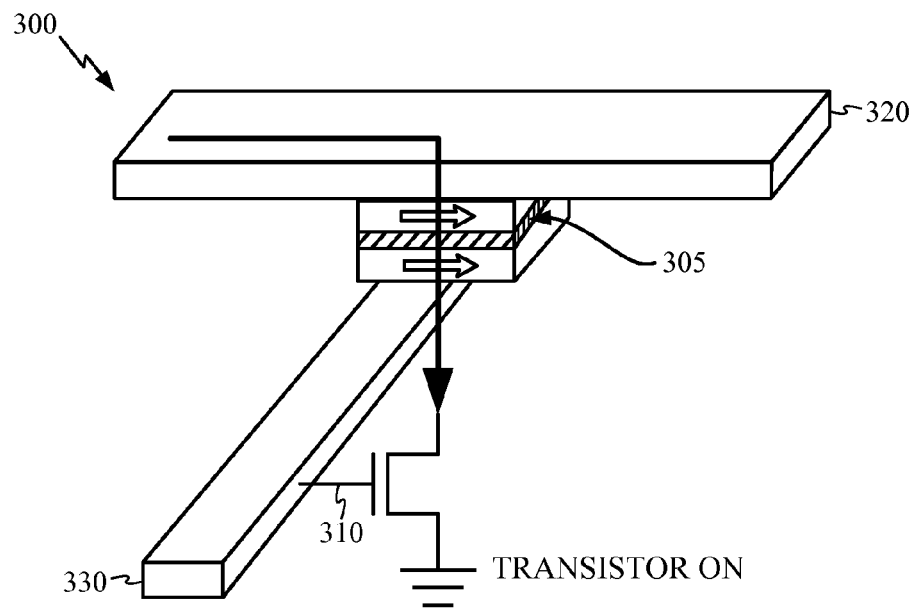
FIGS. 3A and 3B depict Spin Transfer Torque Magnetoresistive Random Access Memory (STT-MRAM) cells.
Figure 3B:
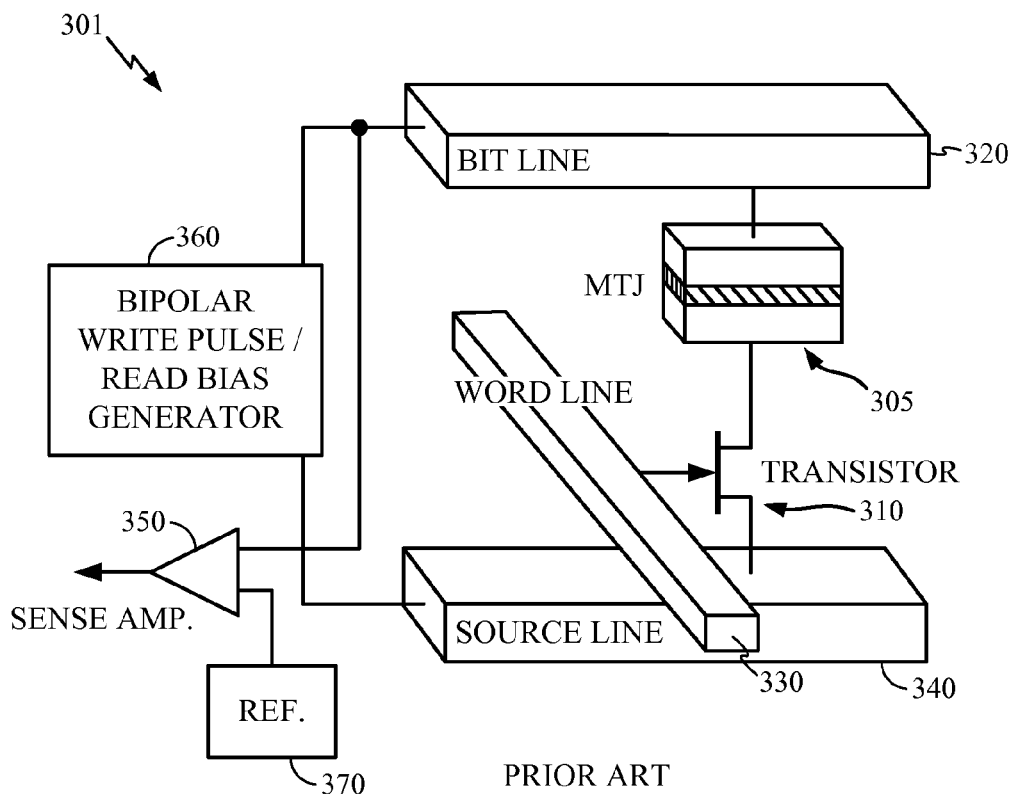
Figure 4:
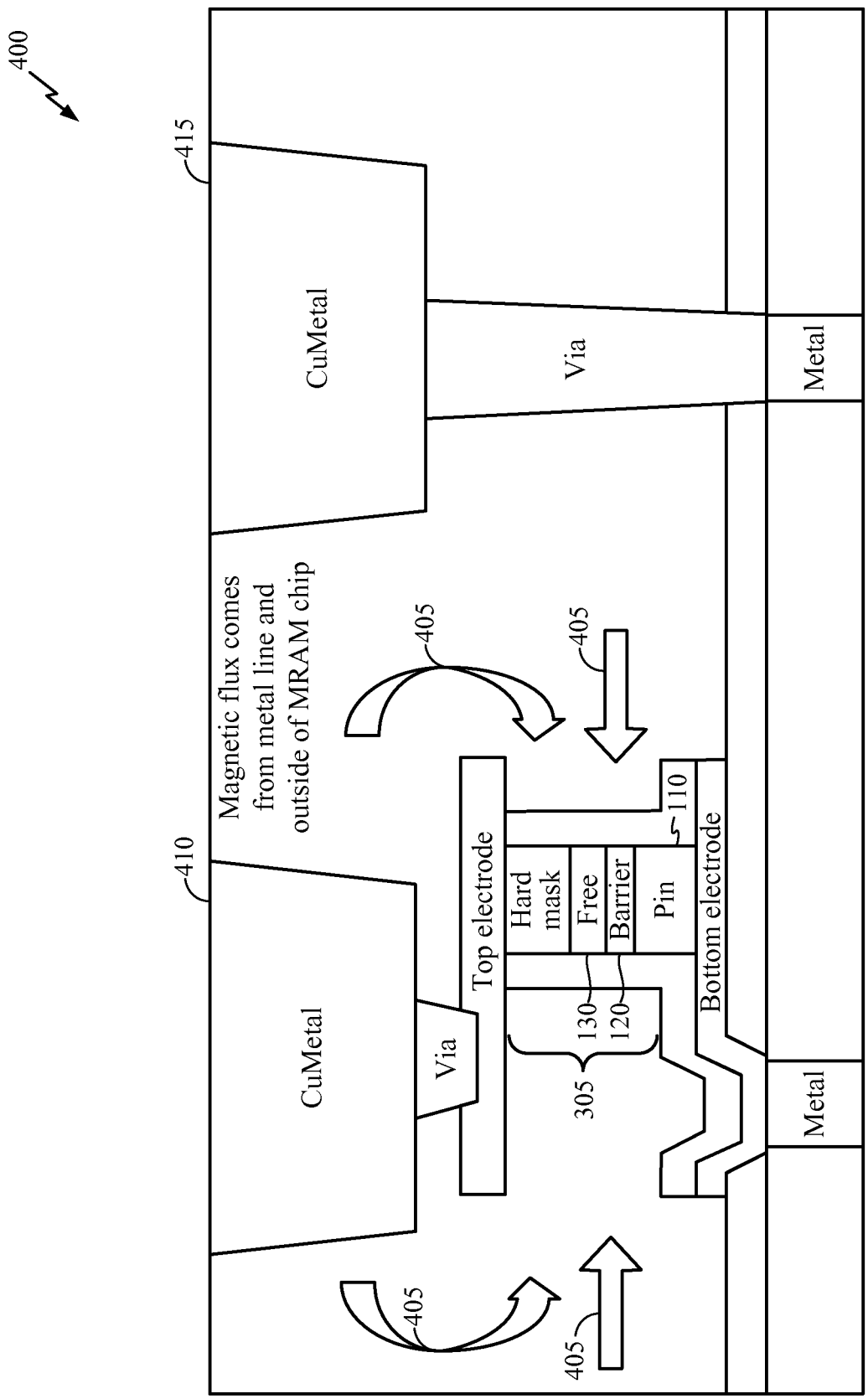
FIG. 4 depicts a performance characteristic of a STT MTJ device.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

An improved magnetic tunnel junction device and methods for fabricating the improved magnetic tunnel junction device are provided. In an example, a two-step etch fabrication process is provided.

The exemplary apparatuses and methods disclosed herein advantageously address the long-felt industry needs, as well as other previously unidentified needs, and mitigate shortcomings of the conventional methods and apparatus. For example, an advantage provided by the disclosed apparatuses and methods herein is an improvement in magnetic tunnel junction (MTJ) device quality and consistency over conventional devices. Another advantage is that the provided two-step etch process simplifies a first etching of an MTJ while causing less etching-induced damage to the MTJ. The two-step etch process also relaxes a second etching of a top electrode and a pin layer of the MTJ. Thus, the disclosed methods reduce etch requirements (e.g., improve an etch margin). Also, etching damage and repositing ablated material are avoided with the provided two-etch process.

Exemplary embodiments are disclosed in this application's text and drawings. Alternate embodiments can be devised without departing from the scope of the invention. Additionally, conventional elements of the current teachings may not be described in detail, or may be omitted, to avoid obscuring aspects of the current teachings.

In this description, certain terminology is used to describe certain features. As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

Spatial descriptions (e.g., "top," "middle," "bottom," "left," "center," "right," "up," "down," "vertical," "horizontal," etc.) used herein are for illustrative purposes only, and are not limiting descriptors. Practical implementations of the structures described hereby can be spatially arranged in any orientation providing the functions described hereby. In addition, in using the term "adjacent" herein to describe a spatial relationship between integrated circuit elements, the adjacent integrated circuit elements need not be in direct physical contact, and other integrated circuit elements can be located between the adjacent integrated circuit elements.

The provided apparatuses can be a part of and/or coupled to, an electronic device having and/or requiring a memory, such as, but not limited to, a mobile device, a mobile telephone, a wireless device, a personal data assistant (PDA), a hand-held computer, a portable computer, a GPS receiver, a navigation device, a camera, an audio player, a camcorder, a game console, a watch, a clock, a calculator, a television, a flat panel display, a computer monitor, an auto display (e.g., an odometer display, etc.), a cockpit control and/or display, a display coupled to a camera (e.g., a rear and/or side view camera in a vehicle), an electronic photograph frame, an electronic billboard, an electronic sign, and/or a projector.

The term "mobile device" can describe, and is not limited to, a mobile phone, a mobile communication device, a pager, a personal digital assistant, a personal information manager, a mobile hand-held computer, a portable computer, a wireless device, a wireless modem, and/or other types of portable electronic devices typically carried by a person and having communication capabilities (e.g., wireless, cellular, infrared, short-range radio, etc.). Further, the terms "user equipment" (UE), "mobile terminal," "mobile device," and "wireless device" can be interchangeable.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention can be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Explanation of the Figures

Figure 5:
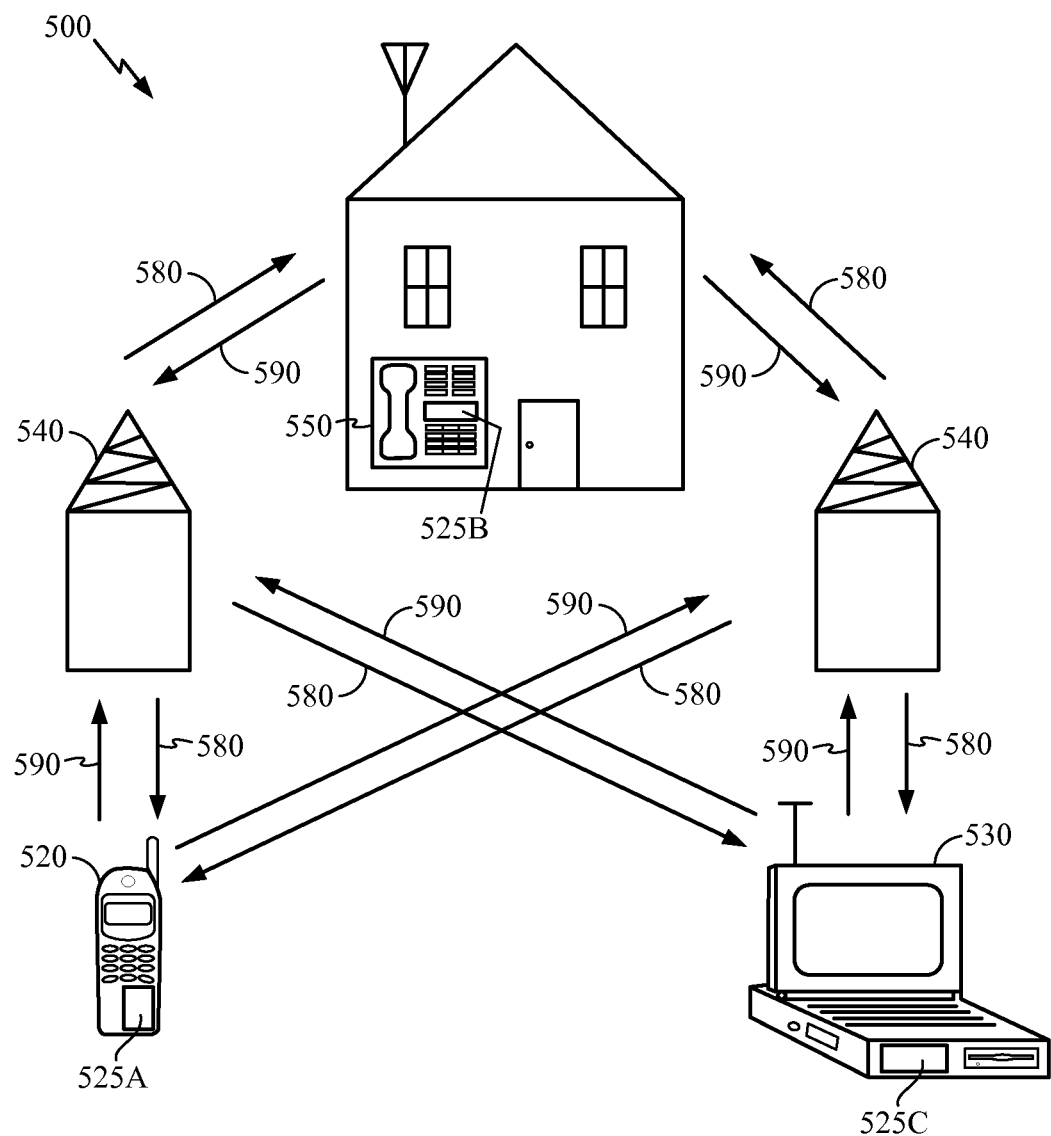
FIG. 5 depicts an exemplary communication system.
Figure 6A:
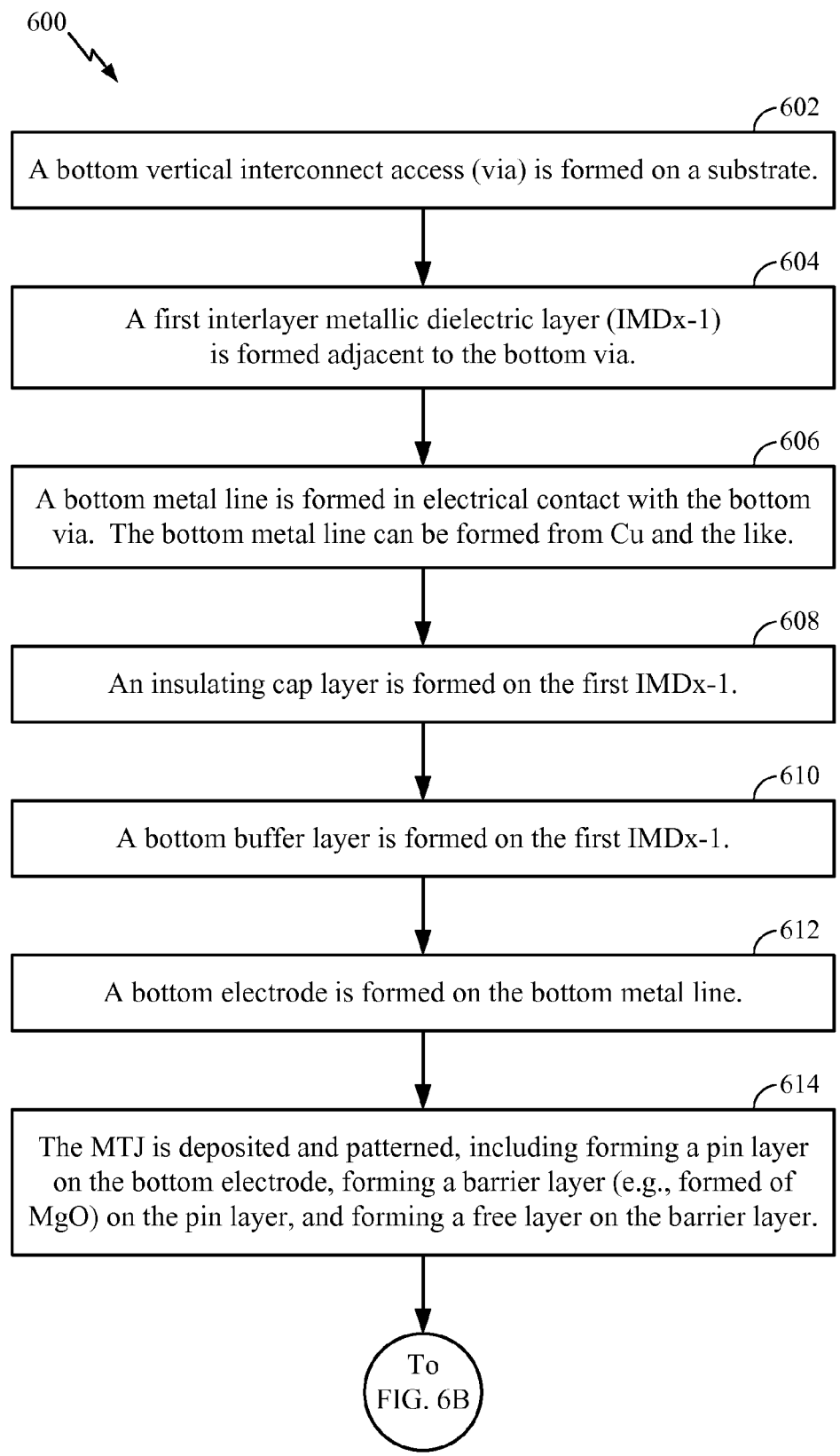
Figure 6B:
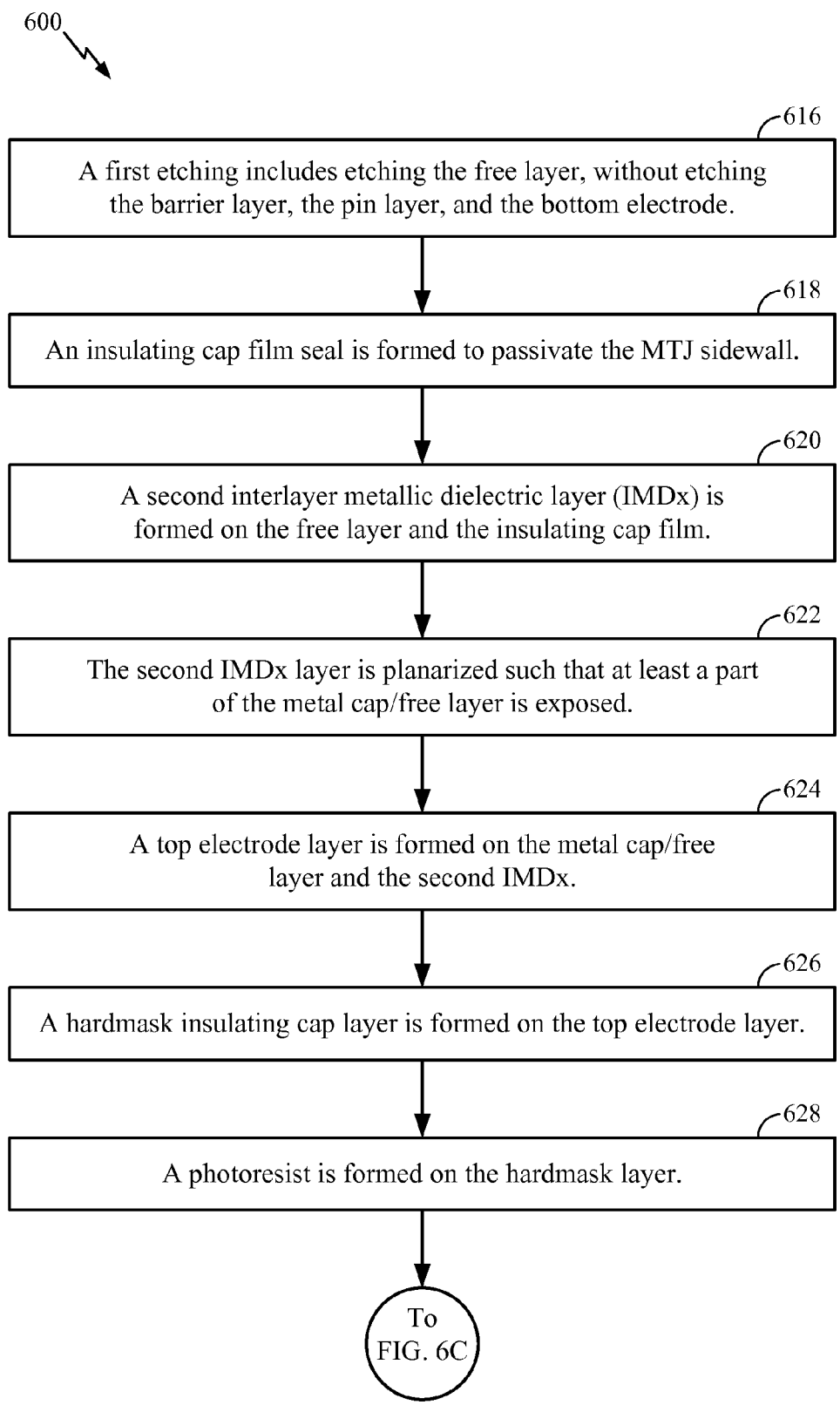
Figure 6C:
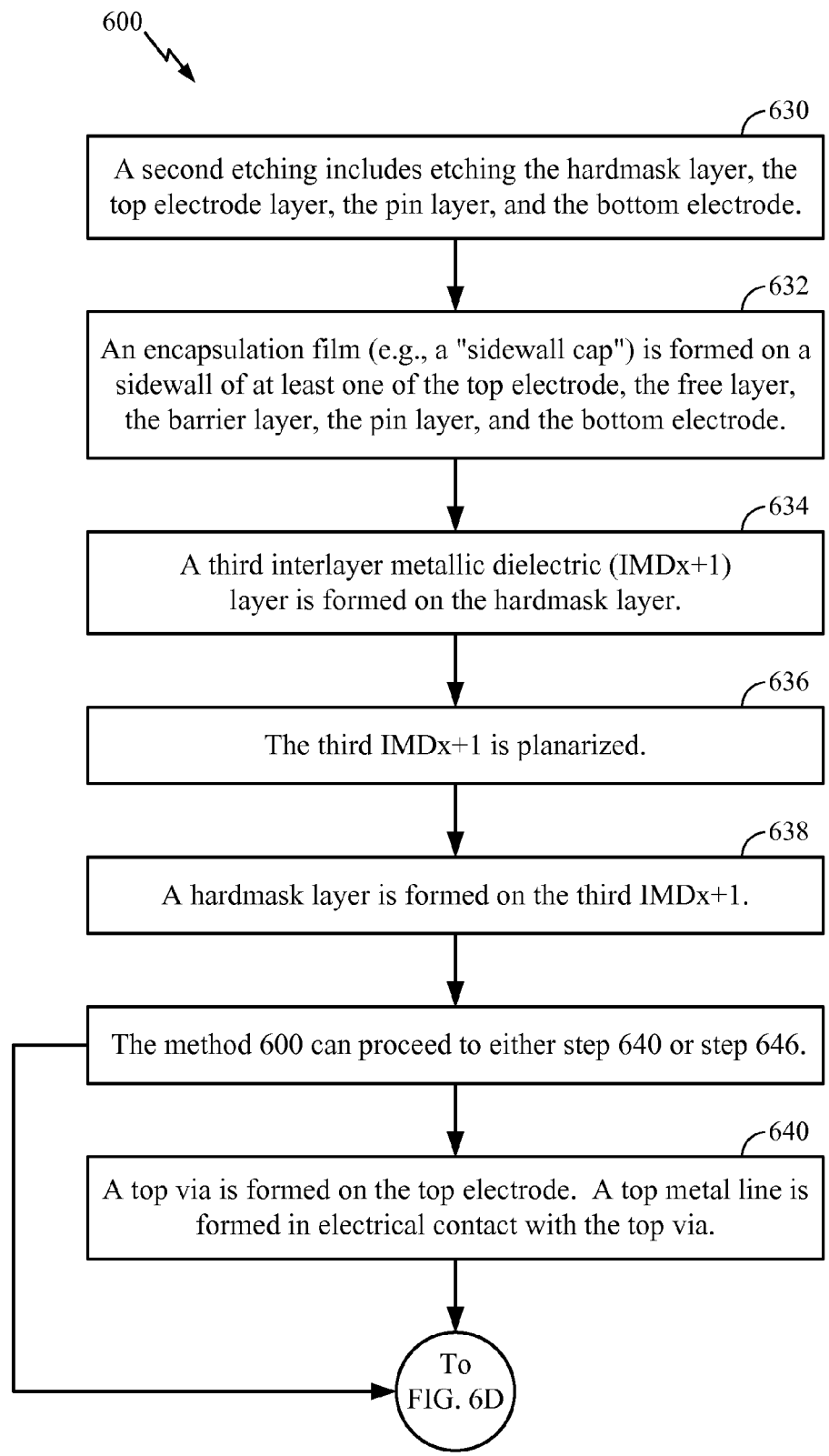
Figure 6D:
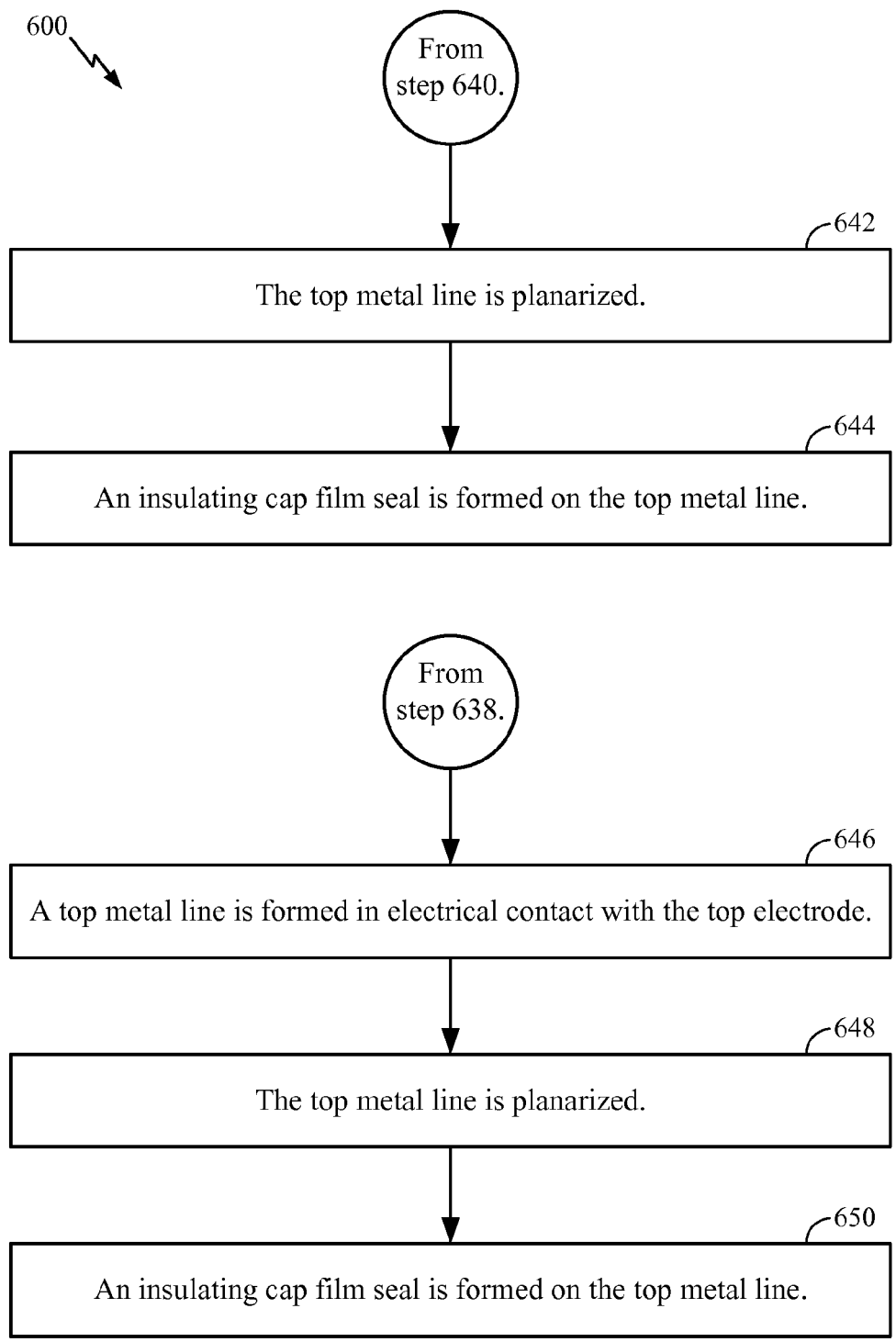

FIG. 5 depicts an exemplary communication system 500 in which an embodiment of the disclosure can be advantageously employed. For purposes of illustration, FIG. 5 shows three remote units 520, 530, and 550 and two base stations 540. However, conventional wireless communication systems can have many more remote units and base stations. The remote units 520, 530, and 550 include at least a part of an embodiment 525A-C of the disclosure as discussed further herein. FIG. 5 shows forward link signals 580 from the base stations 540 and the remote units 520, 530, and 550, as well as reverse link signals 590 from the remote units 520, 530, and 550 to the base stations 540.

In FIG. 5, remote unit 520 is shown as a mobile telephone, remote unit 530 is shown as a portable computer, and remote unit 550 is shown as a fixed location remote unit in a wireless local loop system. For example, the remote units can be mobile phones, hand-held personal communication systems (PCS) units, portable data units such as personal data assistants, GPS enabled devices, navigation devices, set top boxes, music players, video players, entertainment units, fixed location data units such as meter reading equipment, receivers, or any other device that stores or retrieves data or computer instructions, or any combination thereof. Although FIG. 5 depicts remote units, the disclosure is not limited to these exemplary illustrated units. Embodiments of the disclosure can be suitably employed in any device which includes an MTJ device.

FIGS. 6A-6D and 7A-7I depict an exemplary method 600 for fabricating exemplary MTJ structure 700. Etching damage and redepositing ablated material are avoided with the two-step etch process of exemplary method 600. Elements of a particular device layer "x," the layer below, "x−1," and the layer above, "x+1," are depicted. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating. Etching of a material to form at least a portion of a structure described herein can be performed using etching techniques such as plasma etching.

In step 602, a bottom vertical interconnect access (via) 702 is formed on a substrate.

In step 604, a first interlayer metallic dielectric layer (IMDx−1) 704 is formed adjacent to the bottom via 702.

In step 606, a bottom metal line 706 is formed in electrical contact with the bottom via 702. The bottom metal line 706 can be formed from Cu and the like. A bottom electrode contact (BEC) 707 can be formed on the bottom metal line 706.

In step 608, an insulating cap layer 708 is formed on the first IMDx−1 704. The insulating cap layer 708 is a diffusion barrier layer for the bottom metal line 706 and a bottom electrode 710. The insulating cap layer 708 can be formed from SiCN, SiN film, and the like.

In step 610, a bottom buffer layer 712 is formed on the first IMDx−1 704.

In step 612, the bottom electrode 710 is formed on the bottom metal line 706. The bottom electrode 710 can be formed from Ta, TaN, W, Cu, and the like.

In step 614, the exemplary MTJ structure 700 is deposited and patterned, including forming a fix or pin layer 714 on the bottom electrode 710, forming a barrier layer 716 (e.g., formed of MgO) on the fix or pin layer 714, and forming a free layer 718 (e.g., a metal cap) on the barrier layer.

In step 616, a first etching includes etching the free layer 718, without etching the barrier layer 716, the fix or pin layer 714, and the bottom electrode 710.

In step 618, an insulating cap film seal 720 is formed to passivate the MTJ sidewall 722. The insulating cap film seal 720 can be formed by SiN and the like.

Figure 7A:
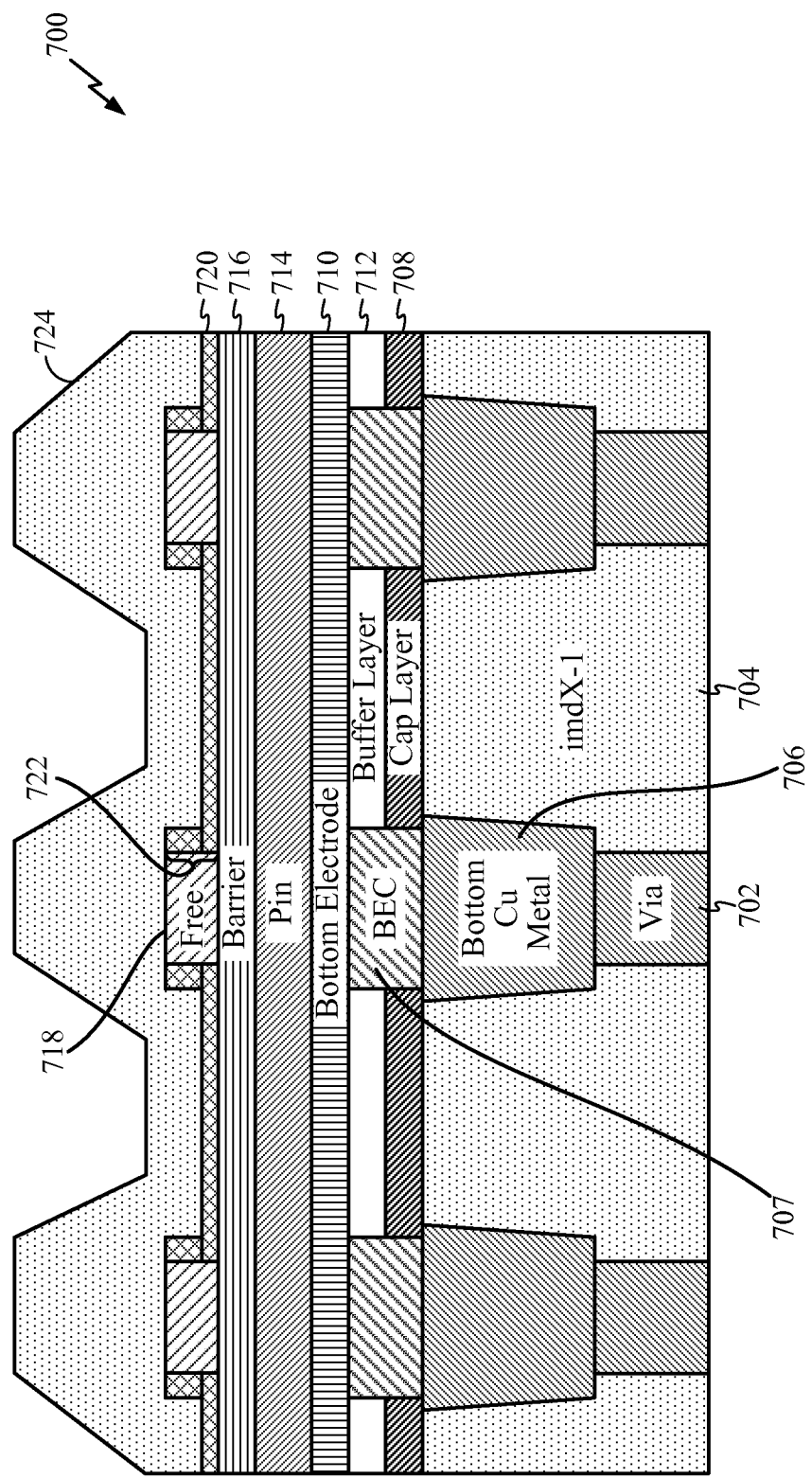

In step 620, a second interlayer metallic dielectric layer (IMDx) 724 is formed on the free layer 718 and the insulating cap film seal 720. FIG. 7A depicts the exemplary MTJ structure 700 after completion of step 620.

In step 622, the second IMDx layer 724 is planarized such that at least a part of the metal cap/free layer 718 is exposed.

In step 624, a top electrode 726 is formed on the metal cap/free layer 718 and the second IMDx layer 724. The top electrode 726 can be formed from Ta, TaN, and the like.

In step 626, a hardmask insulating cap layer 728 is formed on the top electrode 726.

Figure 7B:
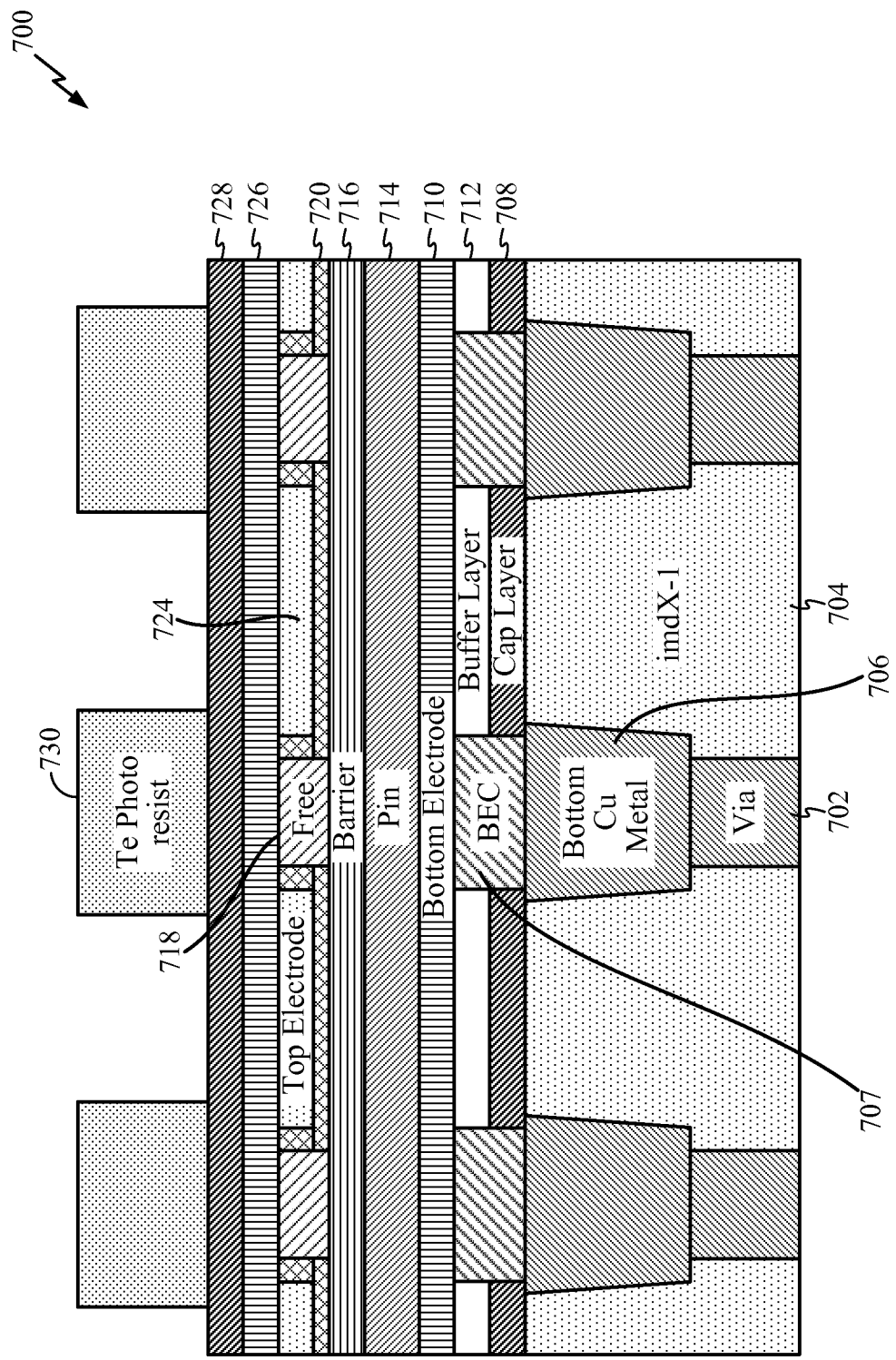

In step 628, a photoresist 730 is formed on the hardmask insulating cap layer 728. The photoresist 730 can have a pattern that determines a shape of the top electrode 726. FIG. 7B depicts the exemplary MTJ structure 700 after completion of step 628.

In step 630, a second etching includes etching the hardmask insulating cap layer 728, the top electrode 726, the barrier layer 716, the fix or pin layer 714, and the bottom electrode 710.

Figure 7C:
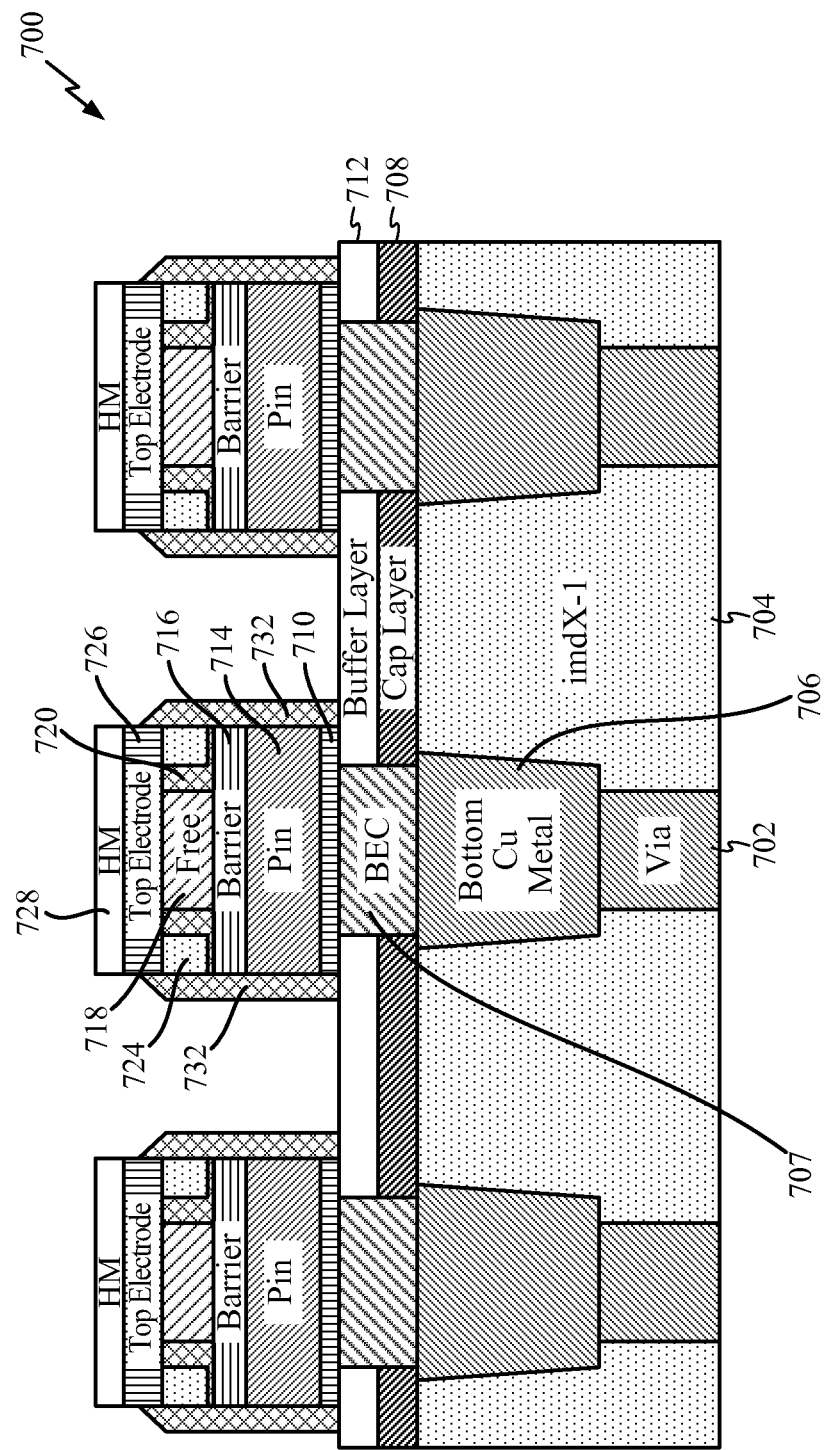

In step 632, an encapsulation film 732 (e.g., a "sidewall cap") is formed on the MTJ sidewall 722 of at least one of the top electrode 726, the free layer 718, the barrier layer 716, the pin layer 714, and the bottom electrode 710. The encapsulation film 732 can be formed from SiN and the like. The encapsulation film 732 can be etched to further form the encapsulation side film. FIG. 7C depicts the exemplary MTJ structure 700 after completion of step 632.

Figure 7D:
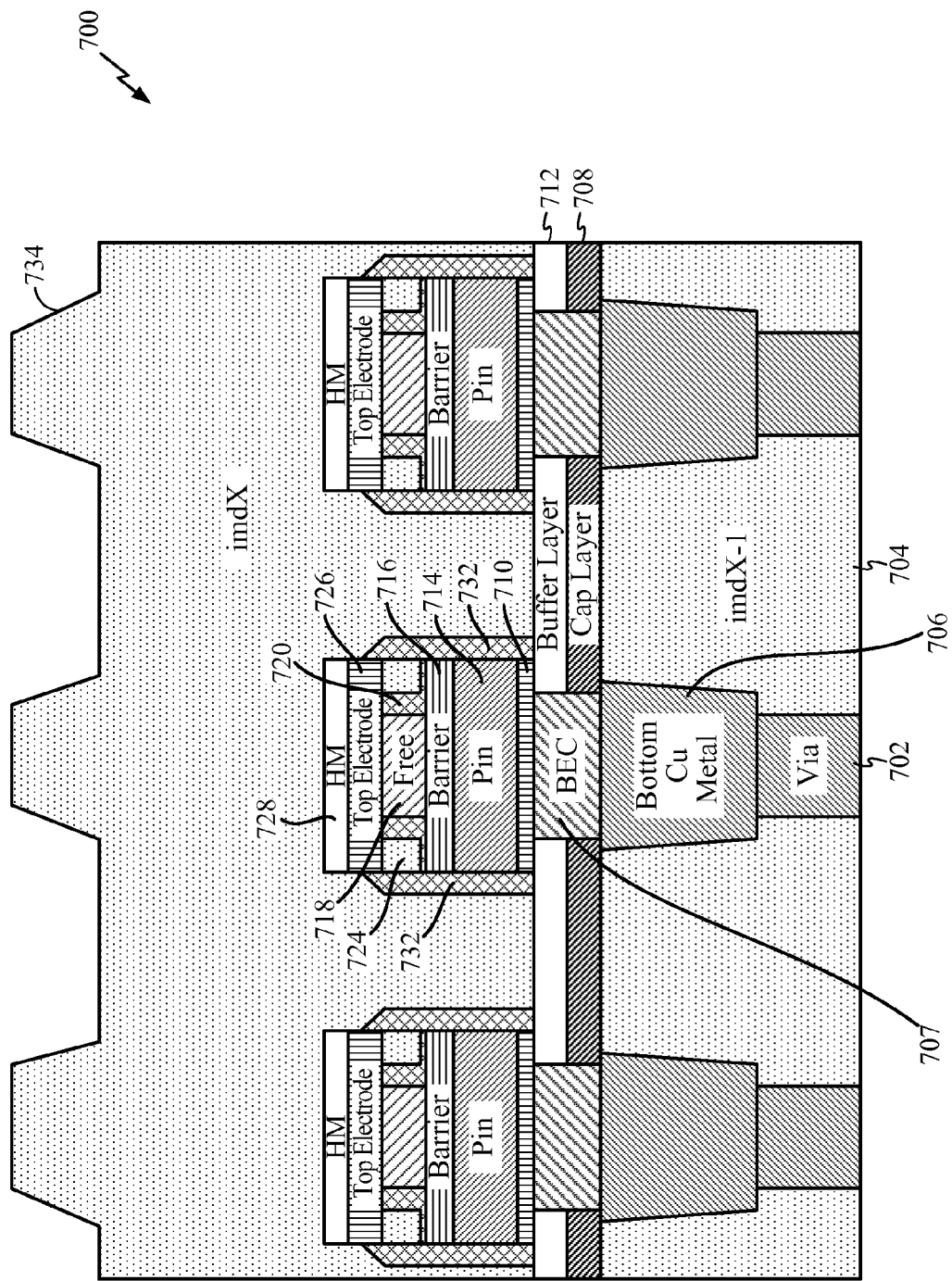

In step 634, a third interlayer metallic dielectric (IMDx+1) layer 734 is formed on the hardmask insulating cap layer 728. FIG. 7D depicts the exemplary MTJ structure 700 after completion of step 634.

In step 636, the third IMDx+1 layer 734 is planarized. The planarization can be performed with chemical mechanical polishing (CMP).

Figure 7E:
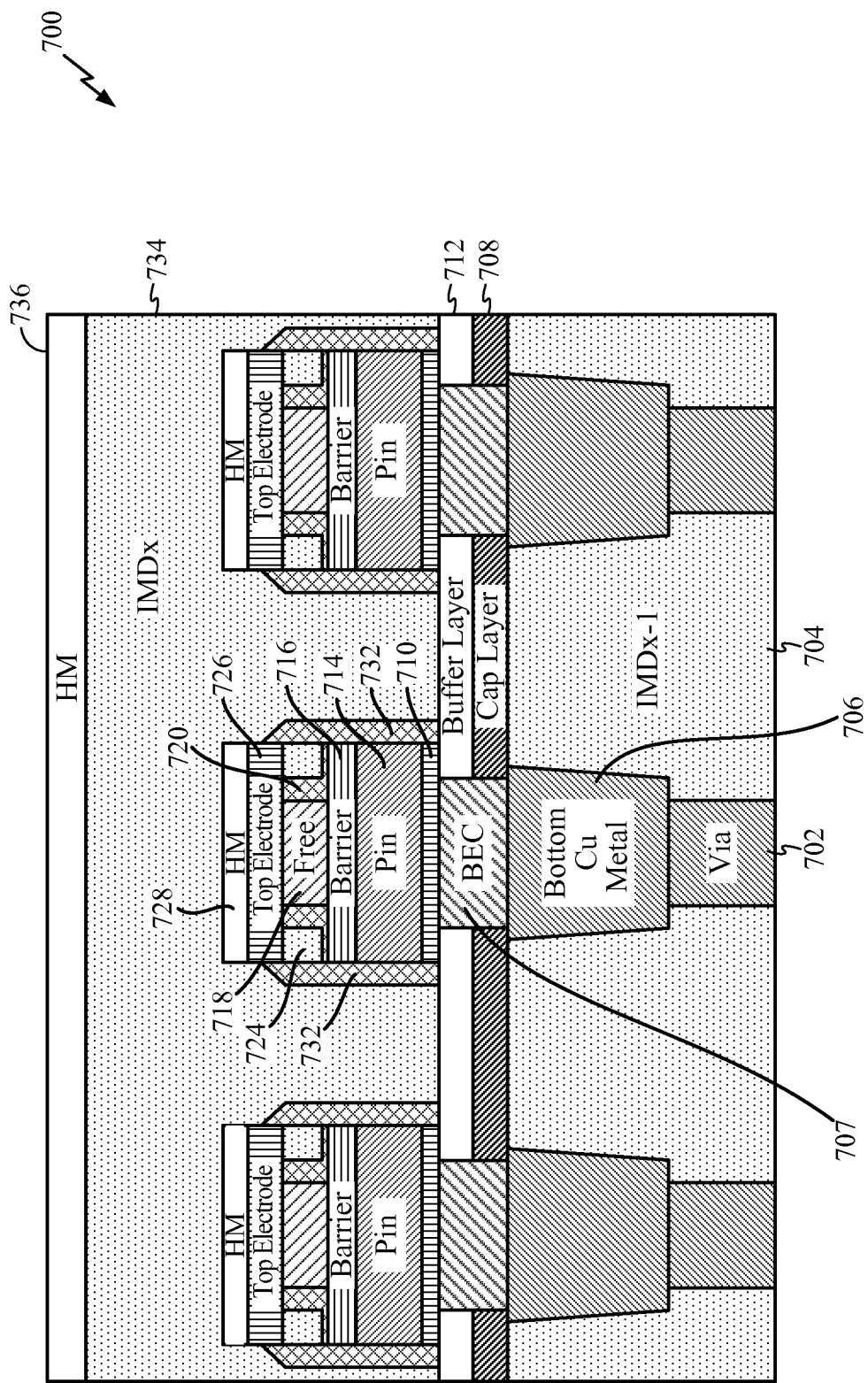

In step 638, a hardmask layer 736 is formed on the third IMDx+1 layer 734. FIG. 7E depicts the exemplary MTJ structure 700 after completion of step 638.

Following step 638, the method 600 can proceed to either step 640 or step 646.

In step 640, a top via 738 is formed on the top electrode 726. A top metal line 740 is formed in electrical contact with the top via 738. The top metal line 740 can be formed from Cu and the like. Additional interlayer metallic dielectric material can be deposited to fill in the region adjacent to the top via 738 and the top metal line 740.

In step 642, the top metal line 740 is planarized (e.g., using CMP).

Figure 7F:
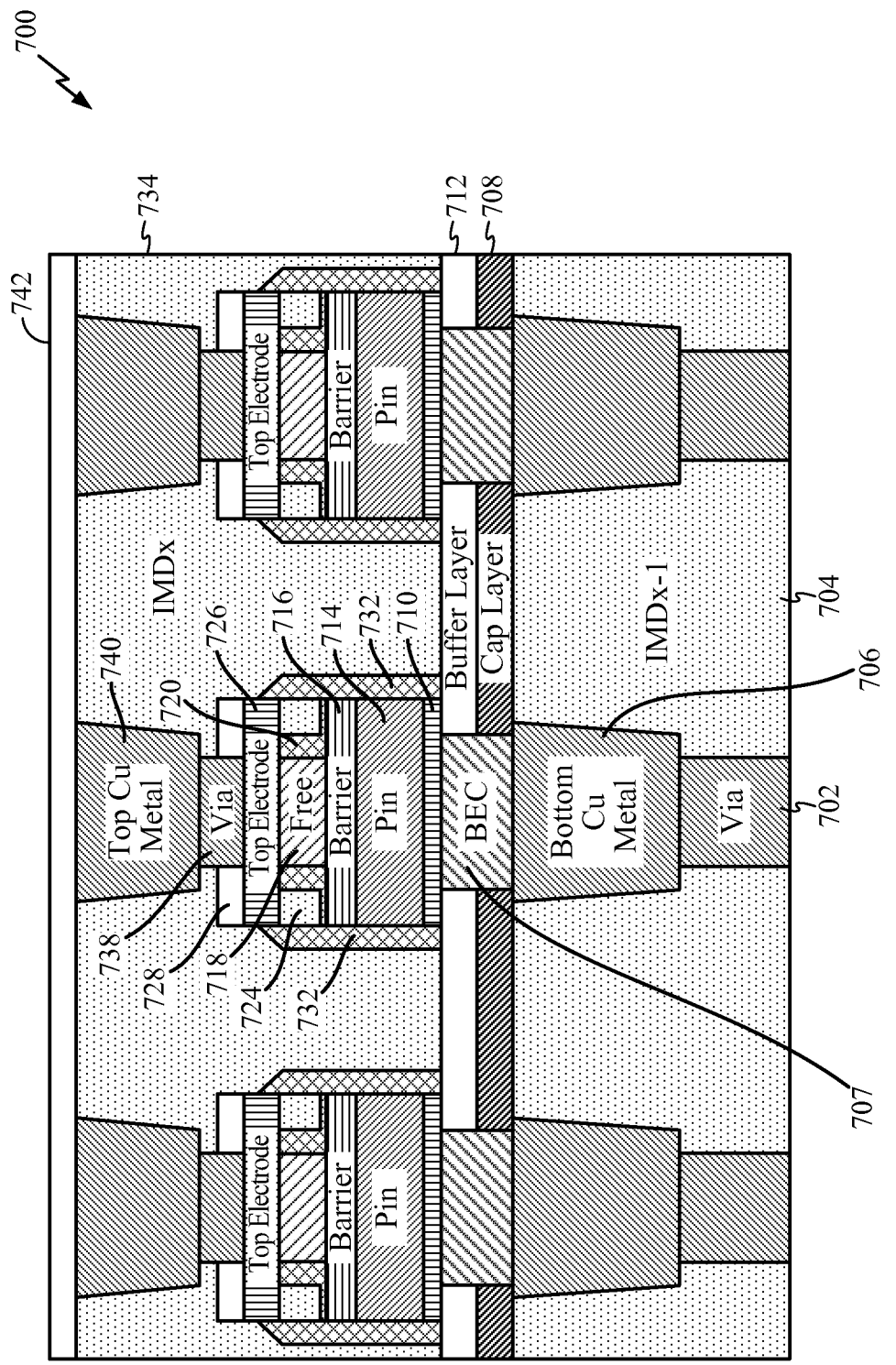

In step 644, an insulating cap film seal 742 is formed on the top metal line 740. The insulating cap film seal 742 can be formed of SiCN and the like. FIG. 7F depicts the exemplary MTJ structure 700 in an x-x' orientation after completion of step 644. FIG. 7G depicts the exemplary MTJ structure 700 in a y-y' orientation after completion of step 644. After executing step 644, the method 600 ends.

In step 646, a top metal line 744 is formed in electrical contact with the top electrode 726. The top metal line can be formed from Cu and the like. Additional interlayer metallic dielectric material can be deposited to fill in the region adjacent to the top metal line 744.

In step 648, the top metal line 744 is planarized (e.g., using CMP).

Figure 7H:
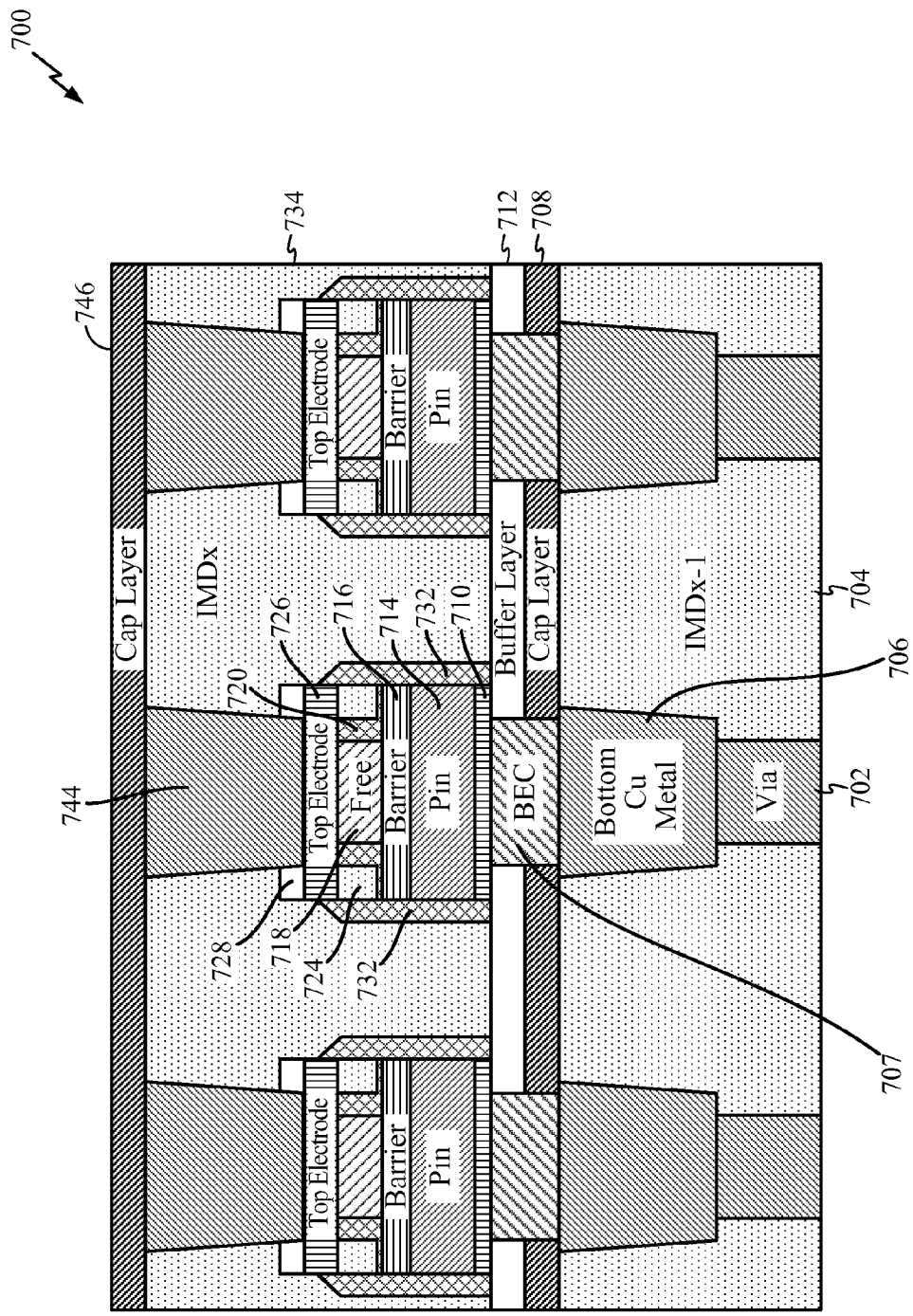
Figure 7I:
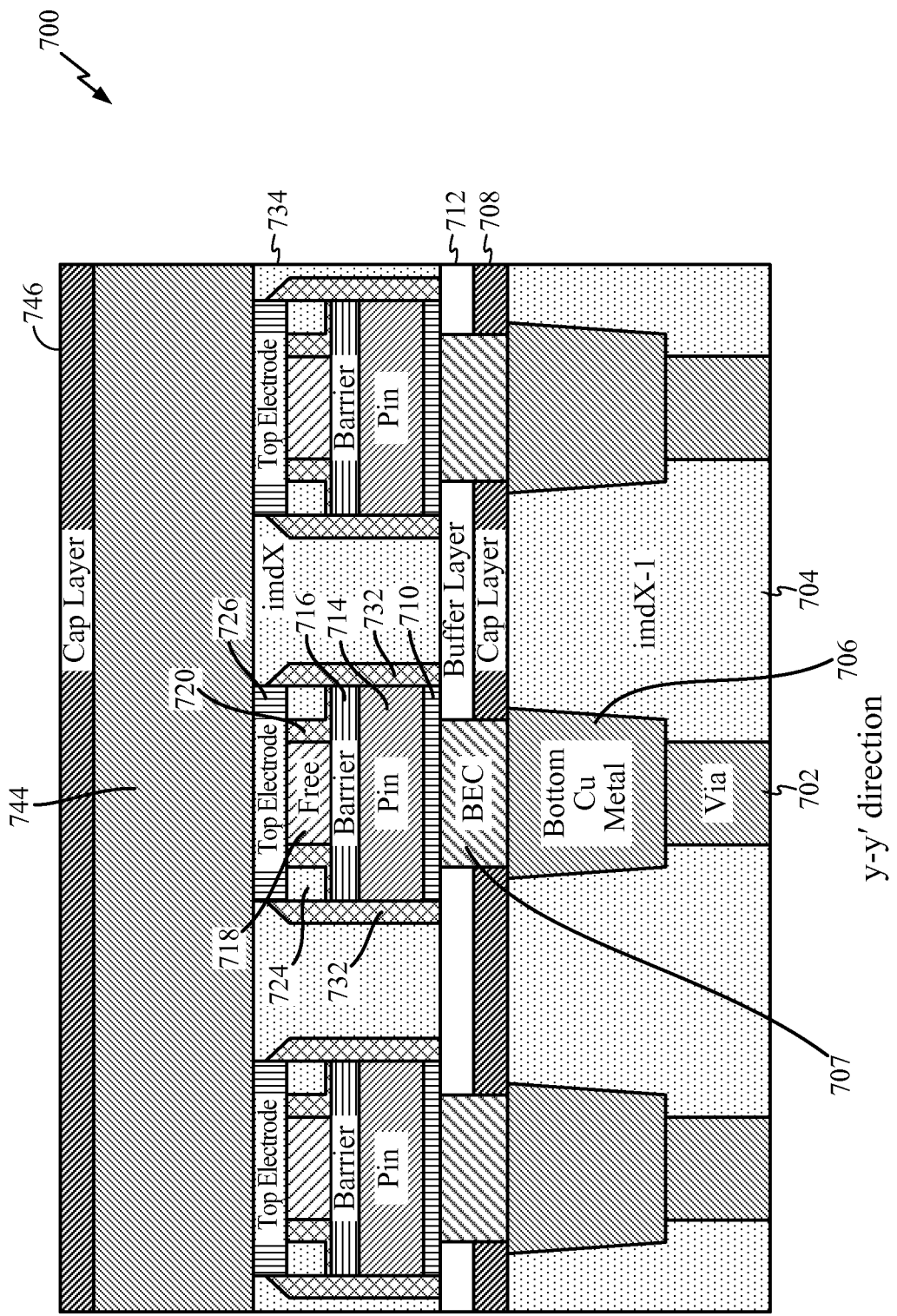
Figure 8A:
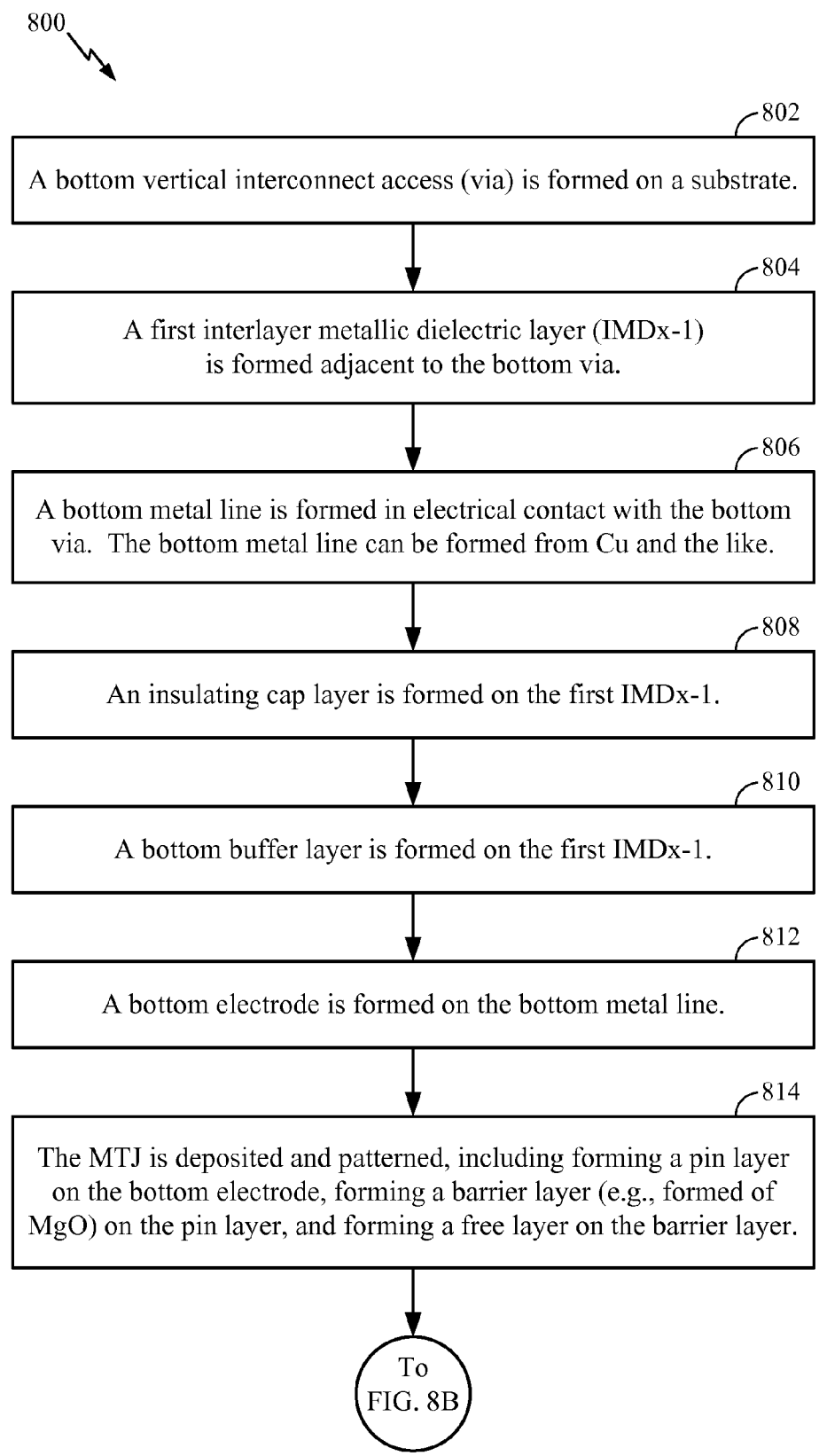
FIGS. 8A-8D and 9A-9I depict an exemplary method for fabricating a second exemplary MTJ structure.
Figure 8B:
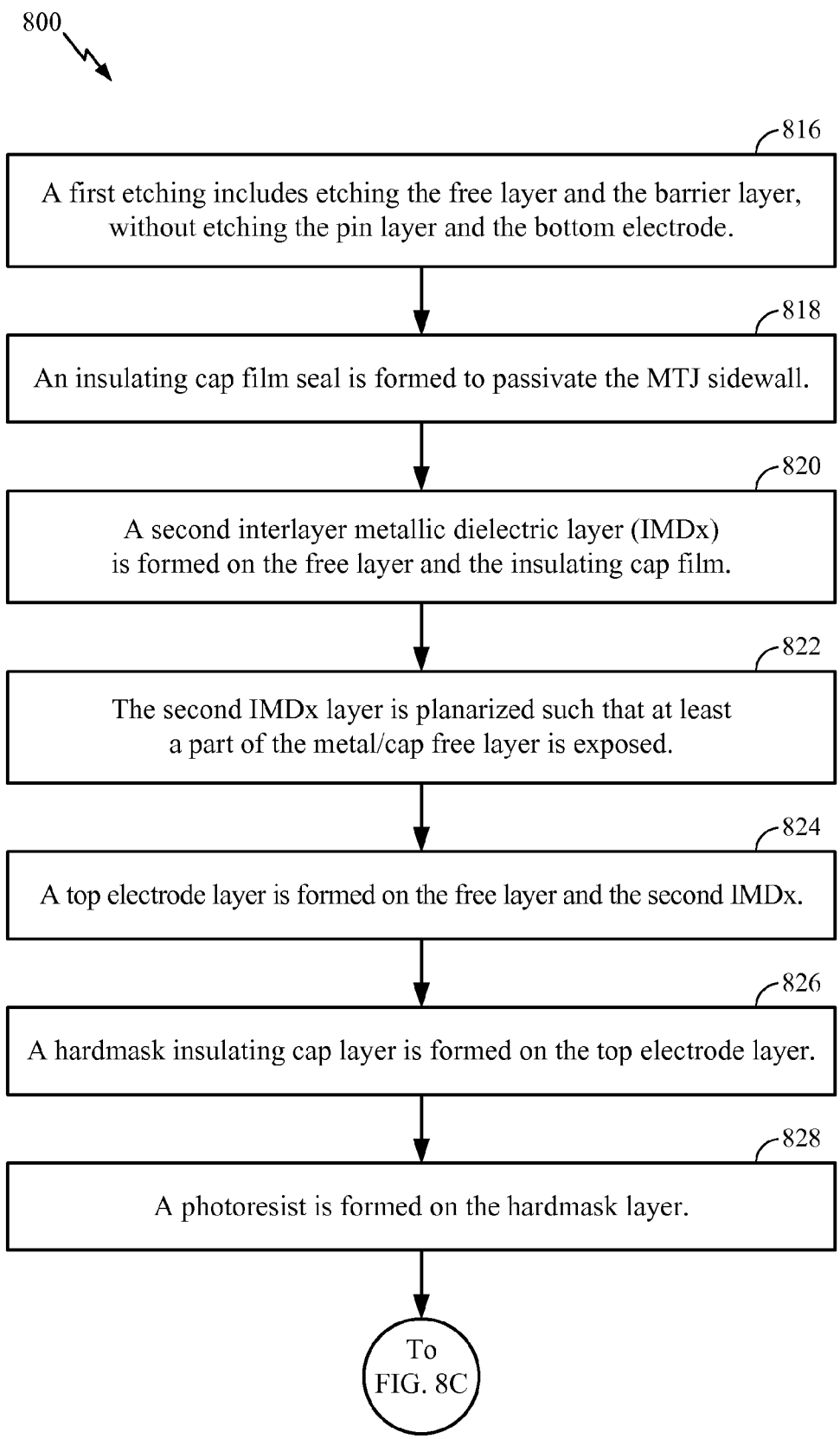
Figure 8C:
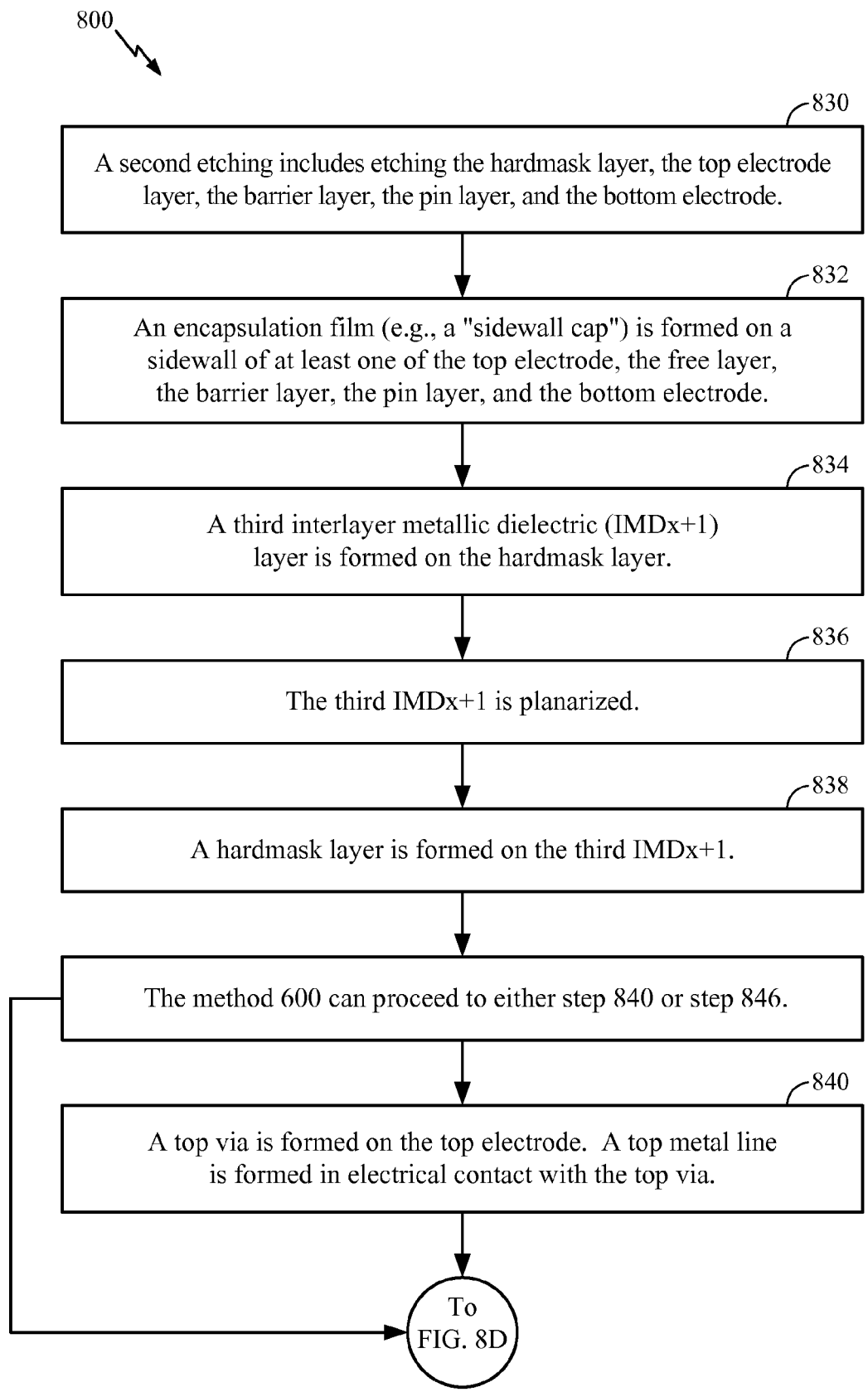
Figure 8D:
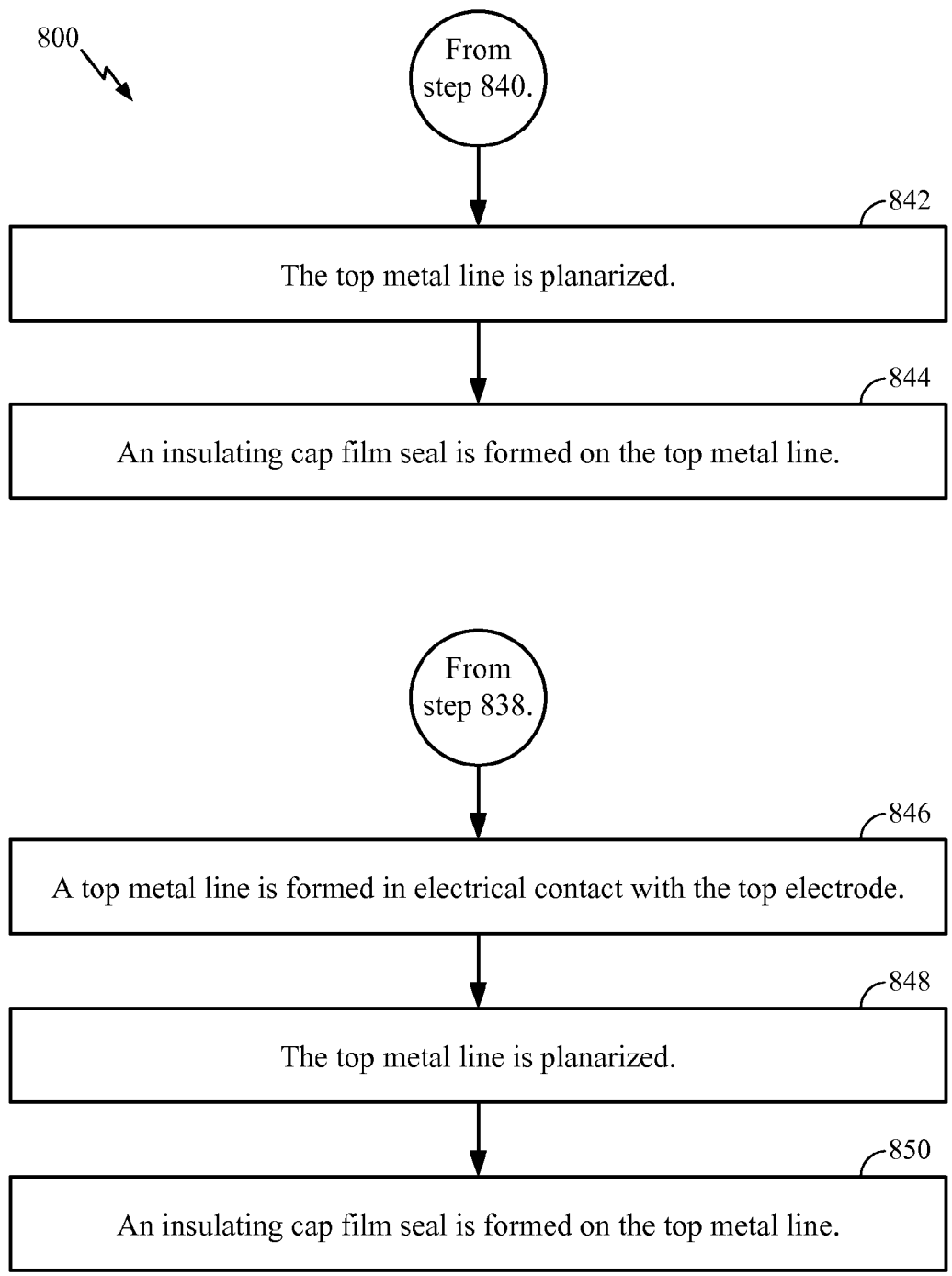

In step 650, an insulating cap film seal 746 is formed on the top metal line. The insulating cap film seal 746 can be formed of SiCN and the like. FIG. 7H depicts the exemplary MTJ structure 700 in an x-x' orientation after completion of step 650. FIG. 7I depicts an exemplary MTJ structure in a y-y' orientation after completion of step 650. After executing step 650, the method 600 ends.

The foregoing steps are not limiting of the various embodiments. The steps can be combined and/or the order rearranged to achieve the configurations depicted and described in relation to FIGS. 6A-6D and 7A-7I.

FIGS. 8A-8D and 9A-9I depict an exemplary method 800 for fabricating exemplary MTJ structure 900. Etching damage and redepositing ablated material are avoided with the two-etch process of exemplary method 800. Elements of a particular device layer "x," the layer below, "x−1," and the layer above, "x+1," are depicted. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating. Etching of a material to form at least a portion of a structure described herein can be performed using etching techniques such as plasma etching.

In step 802, a bottom vertical interconnect access (via) 902 is formed on a substrate.

In step 804, a first interlayer metallic dielectric layer (IMDx−1) 904 is formed adjacent to the bottom via 902.

In step 806, a bottom metal line 906 is formed in electrical contact with the bottom via 902. The bottom metal line 906 can be formed from Cu and the like. A bottom electrode contact (BEC) 907 can be formed on the bottom metal line 906.

In step 808, an insulating cap layer 908 is formed on the first IMDx−1 904. The insulating cap layer 908 is a diffusion barrier layer for the bottom metal line 906 and a bottom electrode 910. The insulating cap layer 908 can be formed from SiCN, SiN film, and the like.

In step 810, a bottom buffer layer 912 is formed on the first IMDx−1 904.

In step 812, the bottom electrode 910 is formed on the bottom metal line 906. The bottom electrode 910 can be formed from Ta, TaN, W, Cu, and the like.

In step 814, the exemplary MTJ structure 900 is deposited and patterned, including forming a pin layer 914 on the bottom electrode 910, forming a barrier layer 916 (e.g., formed of MgO) on the pin layer 914, and forming a free layer 918 on the barrier layer.

In step 816, a first etching includes etching the free layer 918 and the barrier layer 916, without etching the fix or pin layer 914 and the bottom electrode 910.

In step 818, an insulating cap film seal 920 is formed to passivate the MTJ sidewall 922. The insulating cap film seal 920 can be formed of SiN and the like.

Figure 9A:
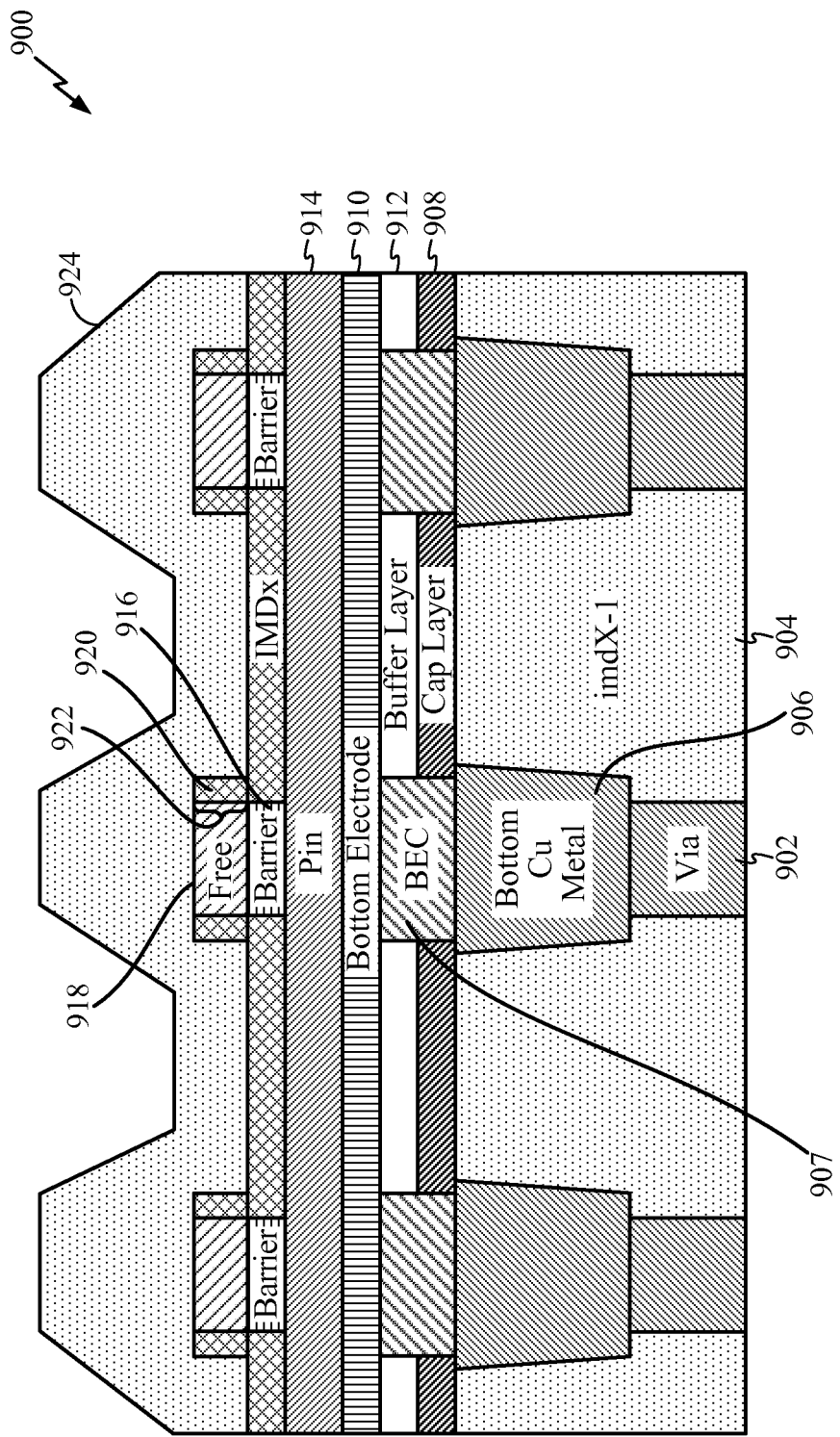

In step 820, a second interlayer metallic dielectric layer (IMDx) 924 is formed on the free layer 918 and the insulating cap film seal 920. FIG. 9A depicts the exemplary MTJ structure 900 after completion of step 820.

In step 822, the second IMDx layer 924 is planarized such that at least a part of the metal cap/free layer 918 is exposed.

In step 824, a top electrode 926 is formed on the metal cap/free layer 918 and the second IMDx layer 924. The top electrode 926 can be formed from Ta, TaN, and the like.

In step 826, a hardmask insulating cap layer 928 is formed on the top electrode 926.

Figure 9B:
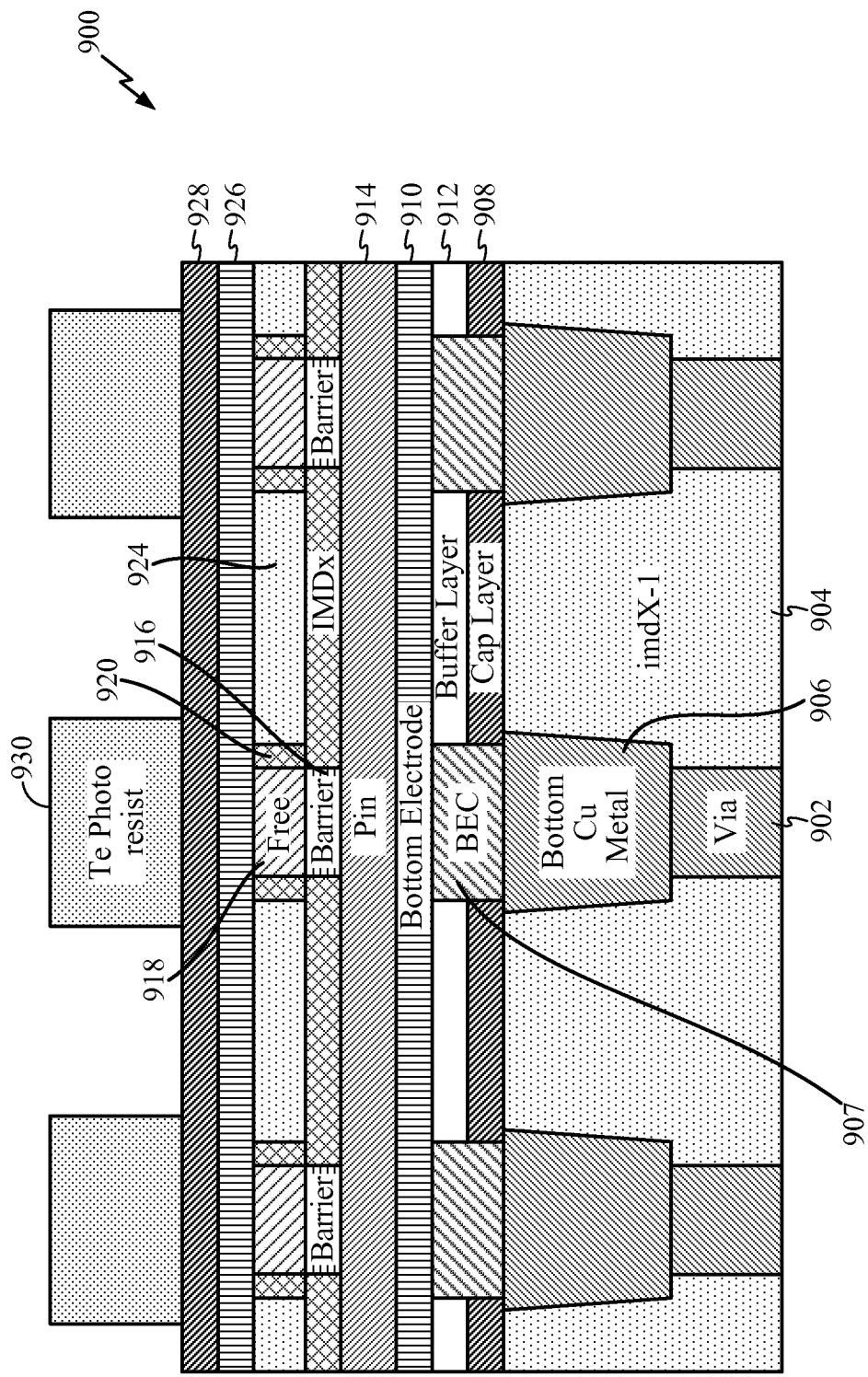

In step 828, a photoresist 930 is formed on the hardmask insulating cap layer 928. The photoresist 930 can have a pattern that determines a shape of the top electrode 910. FIG. 9B depicts the exemplary MTJ structure 900 after completion of step 828.

In step 830, a second etching includes etching the hardmask insulating cap layer 928, the top electrode 926, the pin layer 914, and the bottom electrode 926.

Figure 9C:
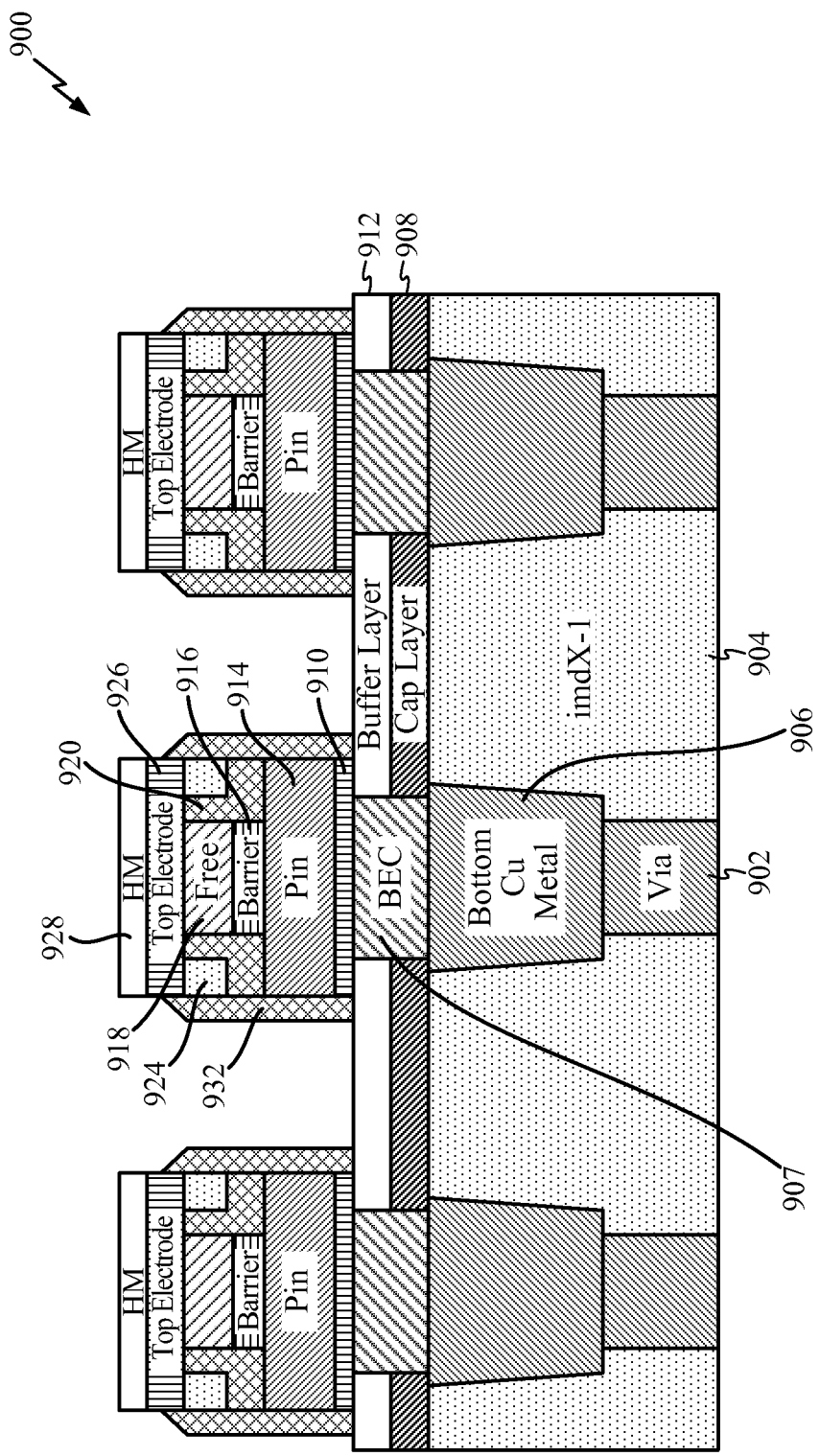

In step 832, an encapsulation film 932 (e.g., a "sidewall cap") is formed on the MTJ sidewall 922 of at least one of the top electrode 926, the free layer 918, the barrier layer 916, the pin layer 914, and the bottom electrode 910. The encapsulation film 932 can be formed from SiN and the like. The encapsulation film 932 can be etched to further form the encapsulation film 932. FIG. 9C depicts the exemplary MTJ structure 900 after completion of step 832.

Figure 9D:
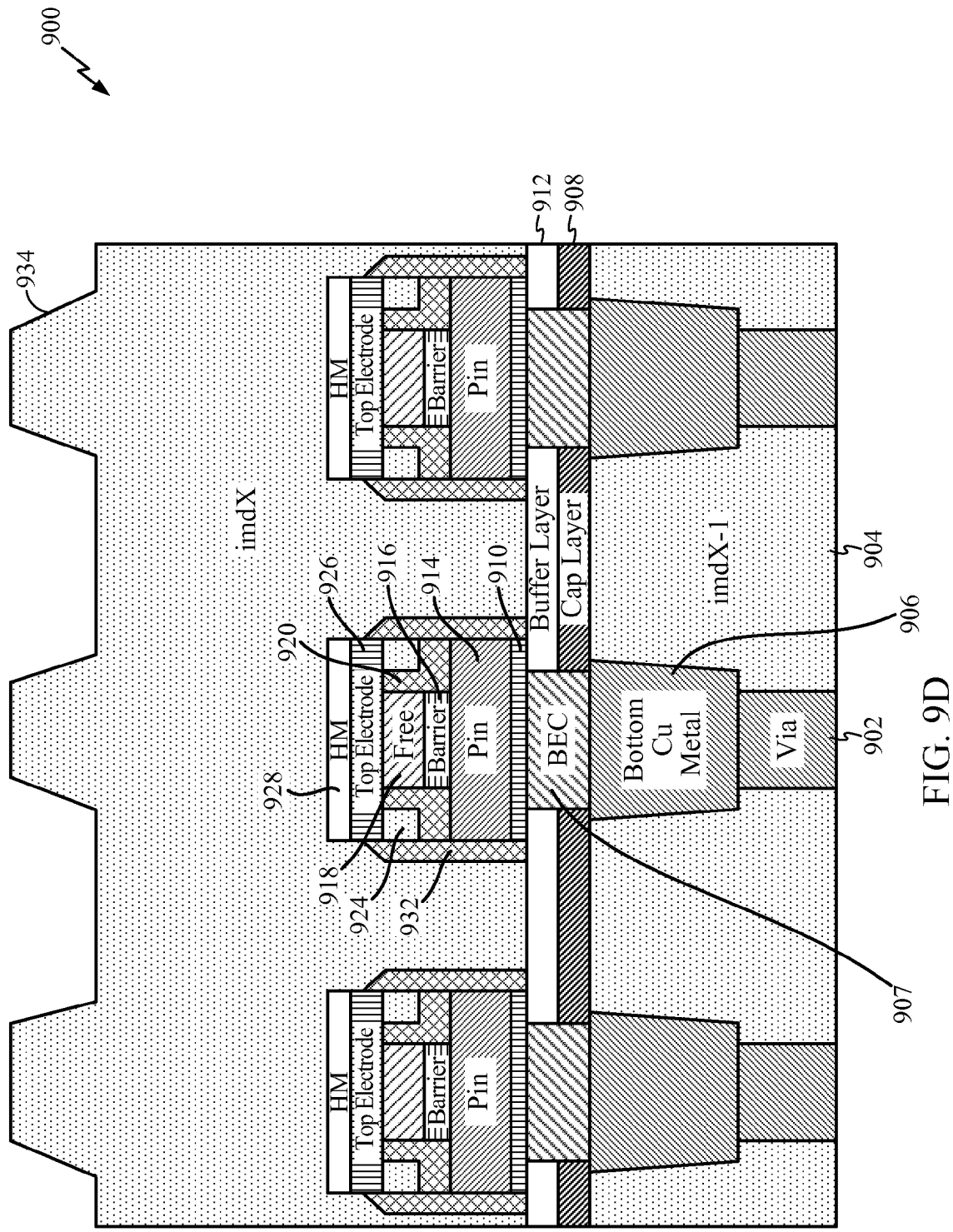

In step 834, a third interlayer metallic dielectric (IMDx+1) layer 934 is formed on the hardmask insulating cap layer 928. FIG. 9D depicts the exemplary MTJ structure 900 after completion of step 834.

In step 836, the third IMDx+1 layer 934 is planarized. The planarization can be performed with chemical mechanical polishing (CMP).

Figure 9E:
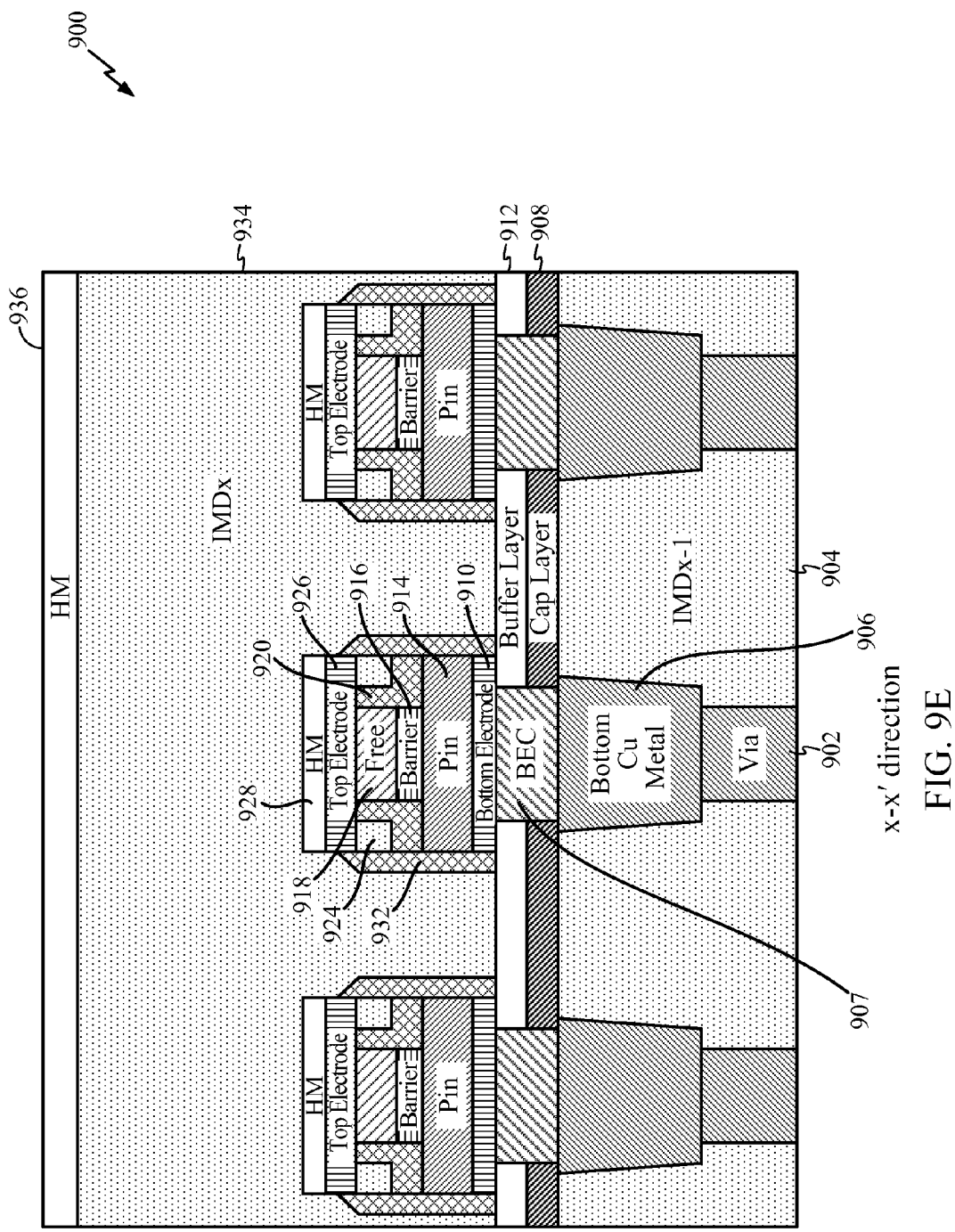

In step 838, a hardmask layer 936 is formed on the third IMDx+1 layer 934. FIG. 9E depicts the exemplary MTJ structure 900 after completion of step 838.

Following step 838, the method 800 can proceed to either step 840 or step 846.

In step 840, a top via 938 is formed on the top electrode 926. A top metal line 940 is formed in electrical contact with the top via 938. The top metal line 940 can be formed from Cu and the like. Additional interlayer metallic dielectric material can be deposited to fill in the region adjacent to the top via 938 and the top metal line 940.

In step 842, the top metal line 940 is planarized (e.g., using CMP).

Figure 9F:
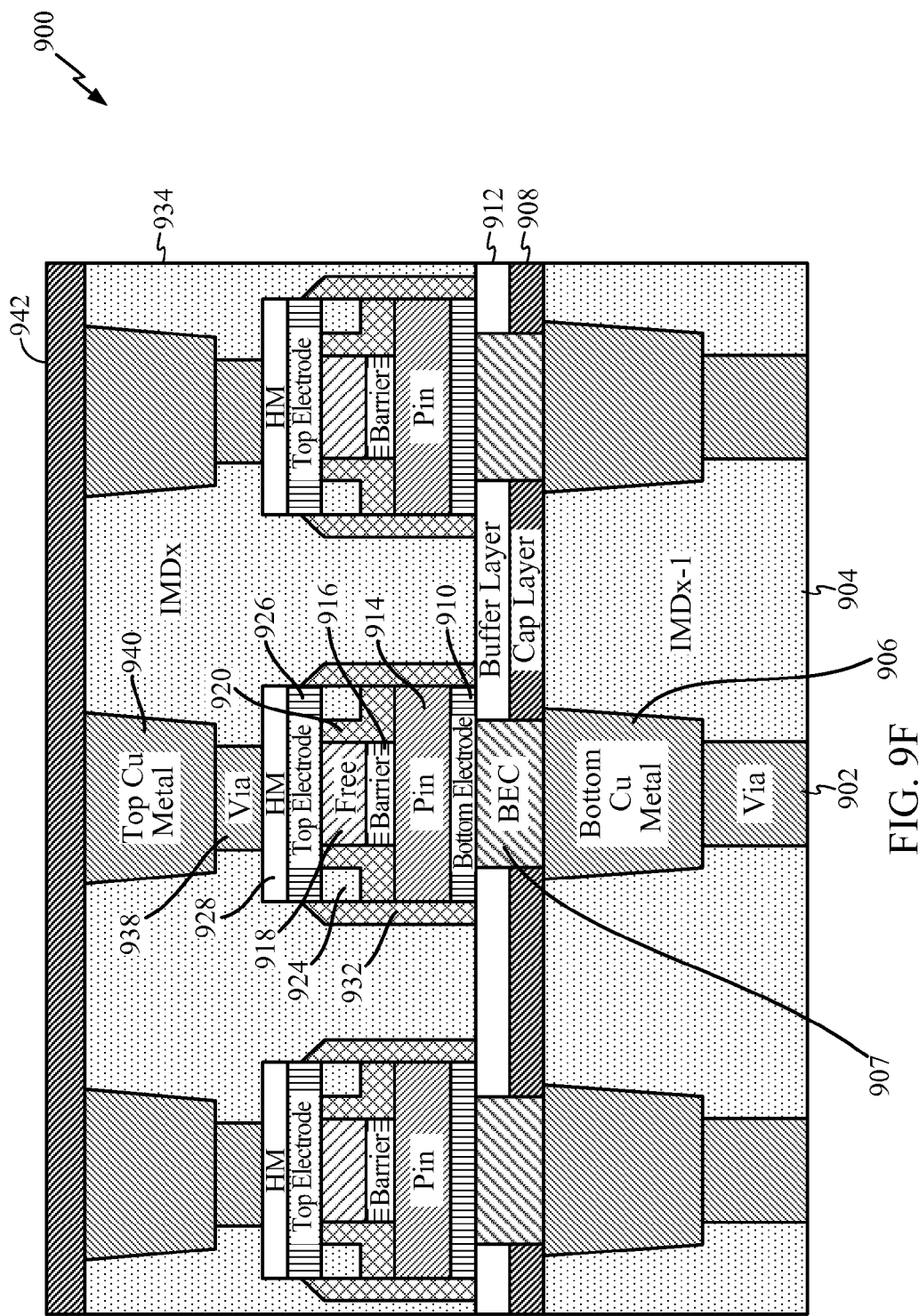
Figure 9G:
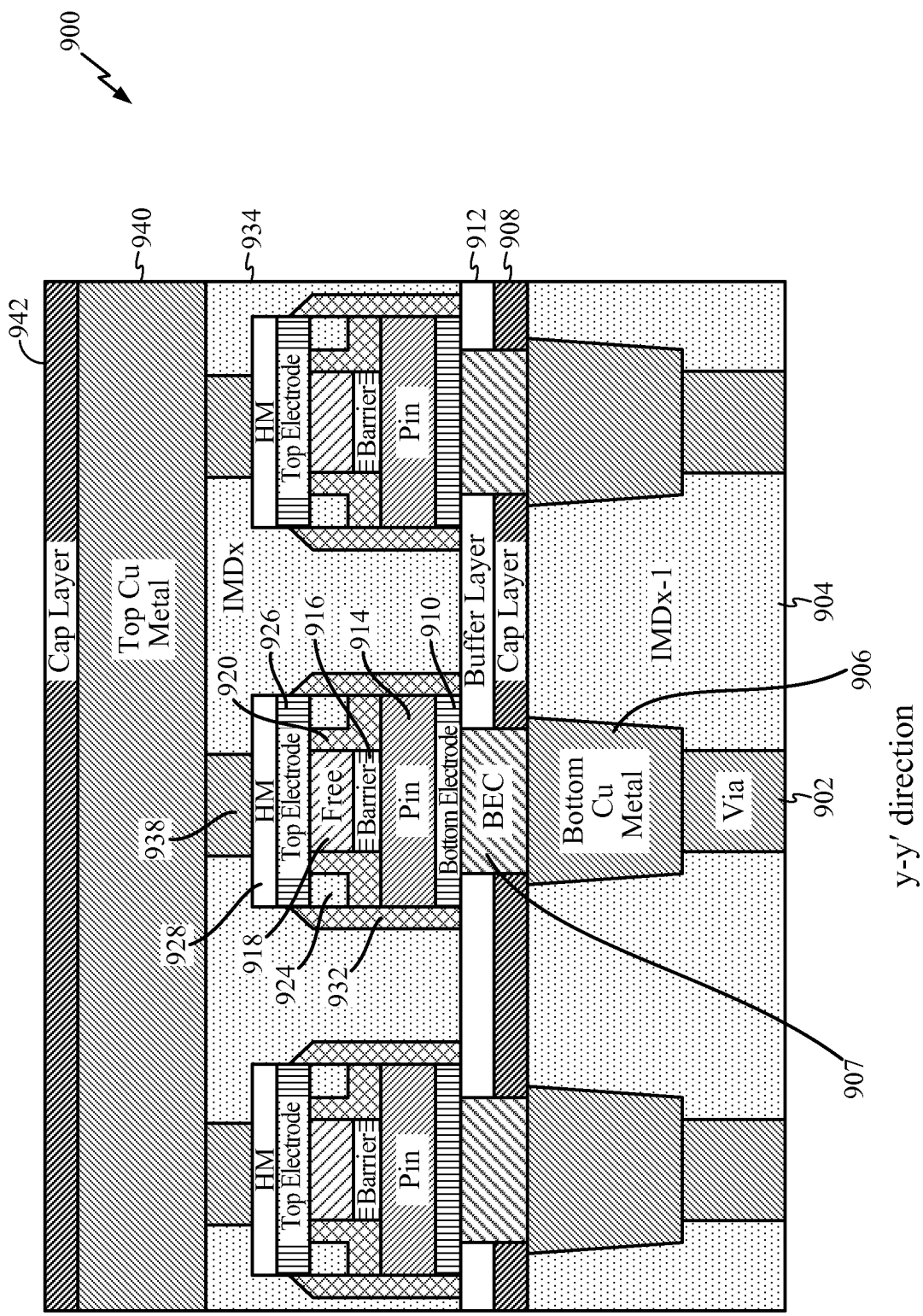

In step 844, an insulating cap film seal 942 is formed on the top metal line 940. The insulating cap film seal 942 can be formed of SiN and the like. FIG. 9F depicts the exemplary MTJ structure 900 in an x-x' orientation after completion of step 844. FIG. 9G depicts the exemplary MTJ structure 900 in a y-y' orientation after completion of step 844. After executing step 844, the method 800 ends.

In step 846, a top metal line 944 is formed in electrical contact with the top electrode 926. The top metal line 944 can be formed from Cu and the like. Additional interlayer metallic dielectric material can be deposited to fill in the region adjacent to the top metal line 944.

In step 848, the top metal line 944 is planarized (e.g., using CMP).

Figure 9H:
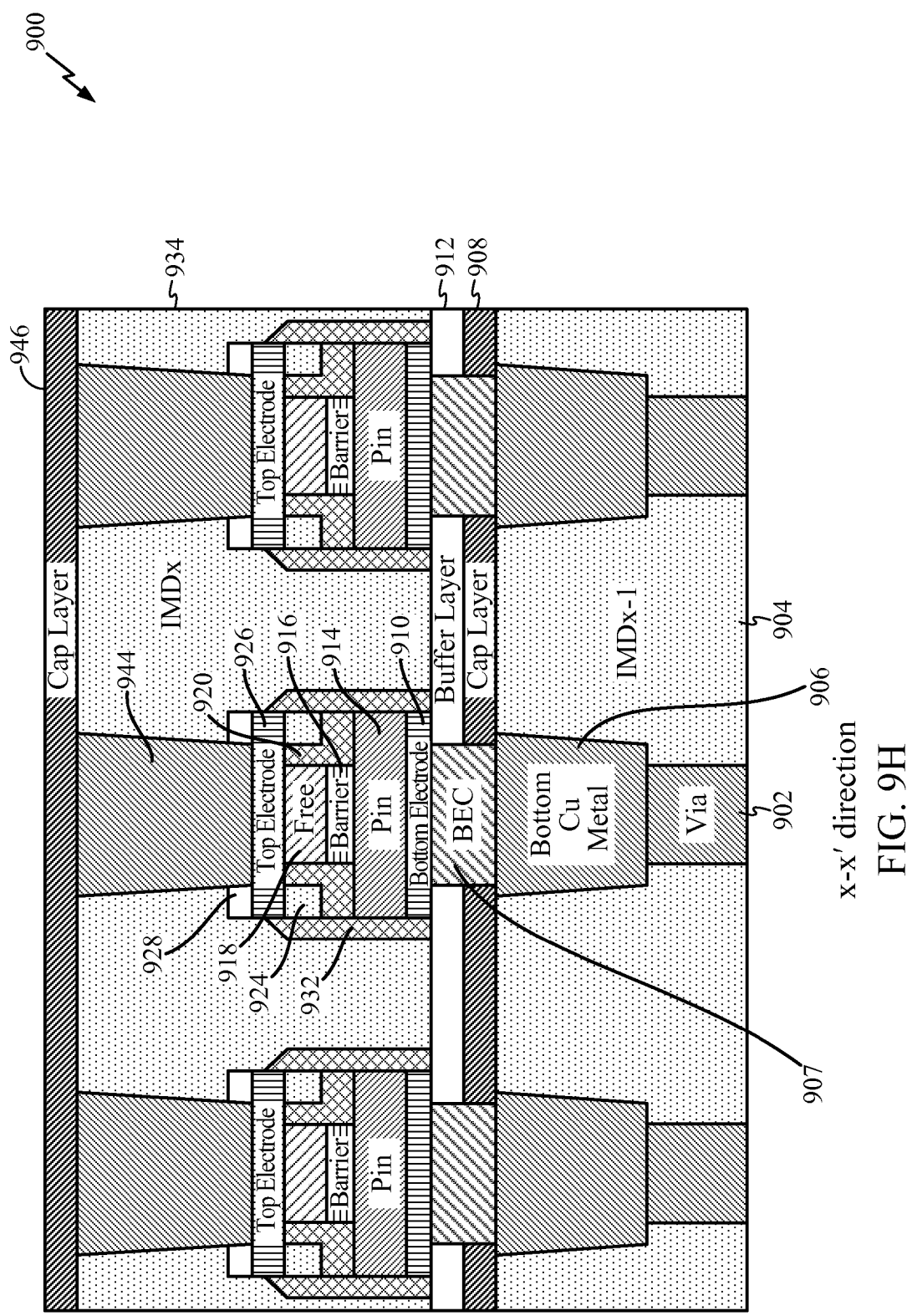
Figure 9I:
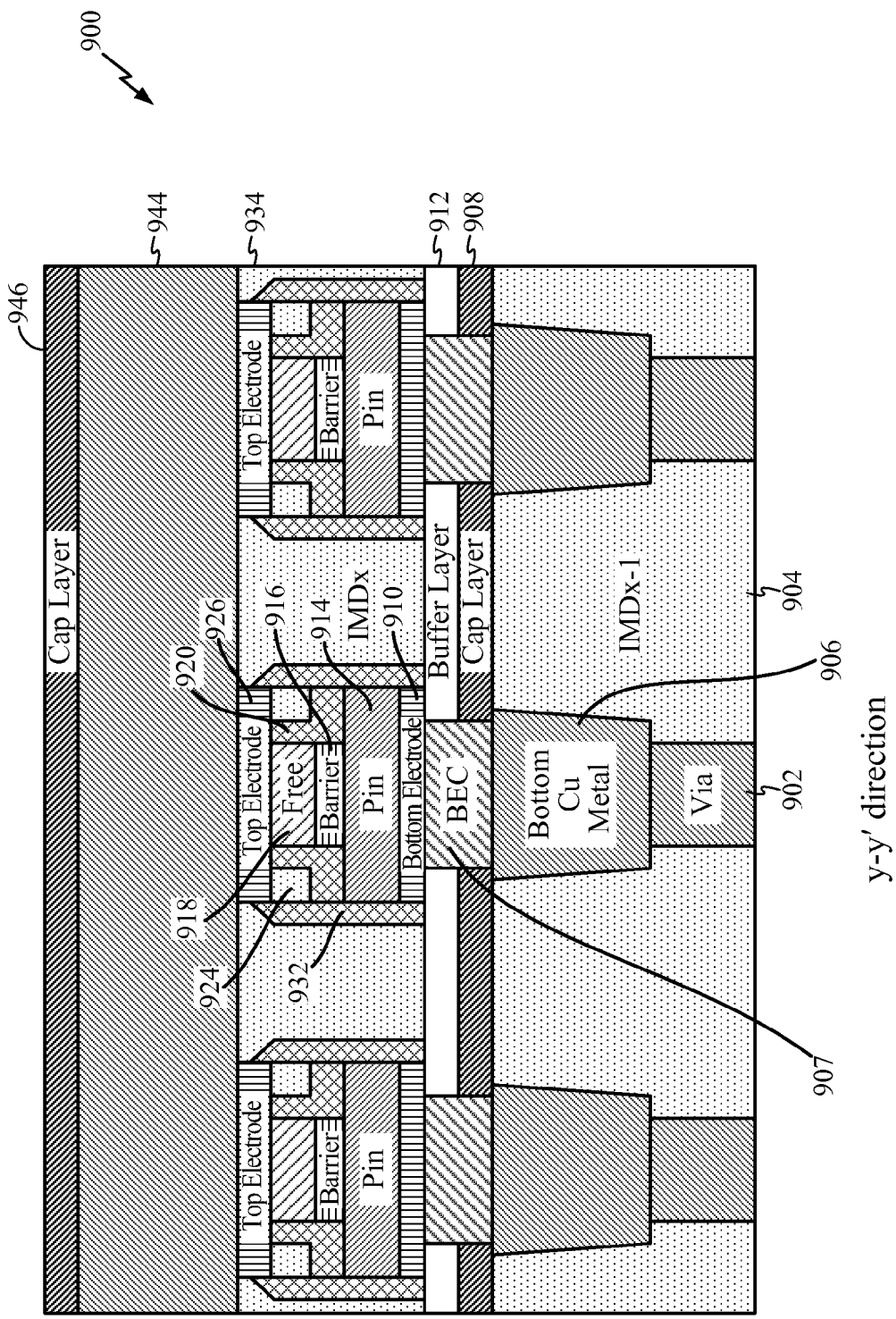

In step 850, an insulating cap film seal 946 is formed on the top metal line 944. The insulating cap film seal 946 can be formed of SiN and the like. FIG. 9H depicts the exemplary MTJ structure 900 in an x-x' orientation after completion of step 850. FIG. 9I depicts the exemplary MTJ structure 900 in a y-y' orientation after completion of step 850. After executing step 850, the method 800 ends.

The foregoing steps are not limiting of the various embodiments. The steps can be combined and/or the order rearranged to achieve the configurations depicted and described in relation to FIGS. 8A-8D and 9A-9I.

Further, those of skill in the art will appreciate that the illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO Re1O, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein can be embodied directly in hardware, in software executed by a processor, or in a combination of the two. In an example, a processor includes multiple discrete hardware components. A software module can reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium can be integral with the processor.

An embodiment of the invention can include a computer readable media embodying a method described herein. Accordingly, the invention is not limited to illustrated examples and any means for performing the functions described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. In an example, the integrated device is on a semiconductor wafer. The semiconductor wafer can be cut into a semiconductor die and packaged into a semiconductor chip. The semiconductor chip can be employed in a device described herein (e.g., a mobile device).

Embodiments can include a non-transitory (i.e., a non-transient) machine-readable media and/or a non-transitory (i.e., a non-transient) computer-readable media embodying instructions which, when executed by a processor (such as a special-purpose processor), transform a processor and any other cooperating devices into a machine (e.g., a special-purpose processor) configured to perform at least a part of a function described hereby and/or transform a processor and any other cooperating devices into at least a part of the apparatus described hereby.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. A method for fabricating a device, comprising:
    fabricating a magnetic tunnel junction, including:
        forming a bottom electrode on a substrate;
        forming a pin layer on the bottom electrode;
        forming a barrier layer on the pin layer;
        forming a free layer on the barrier layer;
        etching the free layer, without etching the barrier layer, the pin layer, and the bottom electrode;
        forming a top electrode on the free layer;
        forming a hardmask layer on the top electrode; and
        etching the hardmask layer; the top electrode, the barrier layer, the pin layer, and the bottom electrode.

2. The method of claim 1, wherein the fabricating further comprises forming a metal line on the top electrode.

3. The method of claim 1, wherein the fabricating further comprises forming a via on the top electrode and a metal line that is coupled through the via to the top electrode.

4. The method of claim 1, further comprising integrating the magnetic tunnel junction into at least one of a first electronic device having a first memory and a second electronic device requiring a second memory.

5. A non-transitory computer-readable medium, comprising executable instructions stored thereon configured to cause a lithographic device to perform a method for fabricating a magnetic tunnel junction, where the method comprises:
   forming a bottom electrode on a substrate;
   forming a pin layer on the bottom electrode;
   forming a barrier layer on the pin layer;
   forming a free layer on the barrier layer;
   etching the free layer, without etching the barrier layer, the pin layer, and the bottom electrode;
   forming a top electrode on the free layer;
   forming a hardmask layer on the top electrode; and
   etching the hardmask layer; the top electrode, the barrier layer, the pin layer, and the bottom electrode.

6. The non-transitory computer-readable medium of claim 5, further comprising instructions stored thereon that cause the lithographic device to form a metal line on the top electrode.

7. The non-transitory computer-readable medium of claim 5, further comprising instructions stored thereon that cause the lithographic device to form a via on the top electrode and a metal line that is coupled through the via to the top electrode.

8. A method for fabricating a magnetic tunnel junction, comprising:
   a step for forming a bottom electrode on a substrate;
   a step for forming a pin layer on the bottom electrode;
   a step for forming a barrier layer on the pin layer;
   a step for forming a free layer on the barrier layer;
   a step for etching the free layer, without etching the barrier layer, the pin layer, and the bottom electrode;
   a step for forming a top electrode on the free layer;
   a step for forming a hardmask layer on the top electrode; and
   a step for etching the hardmask layer; the top electrode, the barrier layer, the pin layer, and the bottom electrode.

9. The method of claim 8, further comprising a step for forming a metal line on the top electrode.

10. The method of claim 8, further comprising a step for forming a via on the top electrode and a metal line that is coupled through the via to the top electrode.

* * * * *